United States Patent
Komura

(10) Patent No.: US 12,445,112 B2
(45) Date of Patent: Oct. 14, 2025

(54) ACOUSTIC WAVE FILTER AND MULTIPLEXER

(71) Applicant: Murata Manufacturing Co., Ltd., Nagaokakyo (JP)

(72) Inventor: Tomohisa Komura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 308 days.

(21) Appl. No.: 18/234,916

(22) Filed: Aug. 17, 2023

(65) Prior Publication Data

US 2024/0080014 A1  Mar. 7, 2024

(30) Foreign Application Priority Data

Sep. 6, 2022  (JP) .................................. 2022-141356

(51) Int. Cl.
*H03H 9/72* (2006.01)
*H03H 9/02* (2006.01)
*H03H 9/64* (2006.01)

(52) U.S. Cl.
CPC .......... *H03H 9/72* (2013.01); *H03H 9/02574* (2013.01); *H03H 9/6433* (2013.01)

(58) Field of Classification Search
CPC ............ H03H 9/145; H03H 9/25; H03H 9/64; H03H 9/72
See application file for complete search history.

(56) References Cited

U.S. PATENT DOCUMENTS

| 6,552,632 | B2* | 4/2003 | Inoue | H03H 9/25 310/313 C |
| 6,570,471 | B2* | 5/2003 | Inoue | H03H 9/6483 333/195 |
| 8,476,991 | B2* | 7/2013 | Goto | H03H 9/6496 333/195 |
| 10,958,246 | B2* | 3/2021 | Miyamoto | H03H 9/6483 |
| 11,444,598 | B2* | 9/2022 | Maeda | H03H 9/6483 |
| 11,929,737 | B2* | 3/2024 | Takata | H03H 9/02992 |
| 11,962,287 | B2* | 4/2024 | Takeuchi | H03H 9/13 |
| 12,212,303 | B2* | 1/2025 | Takeuchi | H03H 9/703 |
| 2022/0123717 | A1 | 4/2022 | Takeuchi | |

FOREIGN PATENT DOCUMENTS

WO  2021/002321 A1  1/2021

* cited by examiner

*Primary Examiner* — Andrea Lindgren Baltzell
*Assistant Examiner* — Alan Wong
(74) *Attorney, Agent, or Firm* — Keating & Bennett, LLP

(57) ABSTRACT

An acoustic wave filter includes at least one of a first series arm resonator circuit in a path connecting input/output terminals and a first parallel arm resonator circuit between a node in the path and ground. At least one of the first series arm resonator circuit and the first parallel arm resonator circuit includes a segmented resonator group including first and second acoustic wave resonators connected in series, an IDT electrode included in the first acoustic wave resonator includes a first withdrawal electrode, and C1/r1>C2/r2 and r1<r2 are satisfied.

18 Claims, 9 Drawing Sheets

ACOUSTIC WAVE FILTER AND MULTIPLEXER

CROSS REFERENCE TO RELATED APPLICATIONS

This application claims the benefit of priority to Japanese Patent Application No. 2022-141356 filed on Sep. 6, 2022. The entire contents of this application are hereby incorporated herein by reference.

BACKGROUND OF THE INVENTION

1. Field of the Invention

The present invention relates to an acoustic wave filter and a multiplexer including an acoustic wave filter.

2. Description of the Related Art

As band pass filters for use in radio frequency circuits such as communication devices, acoustic wave filters are practically used. In view of the effective use of frequency resources for wireless communication, in acoustic wave filters, low loss within a pass band and a change rate of the insertion loss from the pass band to an attenuation band in an end portion of the pass band (hereinbelow, referred to as "steepness") are becoming important performance indices.

International Publication No. 2021/002321 discloses an acoustic wave filter including at least one series arm resonator circuit and at least one parallel arm resonator circuit. Specifically, in the foregoing acoustic wave filter, the at least one series arm resonator circuit or the at least one parallel arm resonator circuit or both the at least one series arm resonator circuit and the at least one parallel arm resonator circuit are each formed as a segmented resonator group, and IDT (InterDigital Transducer) electrodes of two or more of segmented resonators included in this segmented resonator group include withdrawal electrodes having different electrode finger structures. According to this configuration, it becomes possible to improve the steepness in the vicinity of the pass band and reduce unwanted waves (spurious emissions) outside the pass band.

The acoustic wave filter disclosed in International Publication No. 2021/002321 focuses on the electrode finger structure of the withdrawal electrode of the segmented resonator to improve the steepness in the vicinity of the pass band and reduce the spurious emissions outside the pass band. However, it is difficult to reduce the spurious emissions outside the pass band while securing low loss within the pass band of the acoustic wave filter only by adjusting the electrode finger structure of the withdrawal electrode of the segmented resonator.

SUMMARY OF THE INVENTION preferred embodiments of the present invention provide acoustic wave filters and multiplexers in each of which spurious emissions outside a pass band are reduced while securing low loss within the pass band.

An acoustic wave filter according to a preferred embodiment of the present invention includes a first input/output terminal and a second input/output terminal, and at least one series arm resonator circuit in a path connecting the first input/output terminal and the second input/output terminal or at least one parallel arm resonator circuit each between a node in the path and ground or both of the at least one series arm resonator circuit and the at least one parallel arm resonator circuit, wherein each of the at least one series arm resonator circuit or each of the at least one parallel arm resonator circuit or each of both the at least one series arm resonator circuit and the at least one parallel arm resonator circuit includes an acoustic wave resonator including an IDT electrode on a substrate having piezoelectricity, a first series arm resonator circuit of the at least one series arm resonator circuit or a first parallel arm resonator circuit of the at least one parallel arm resonator circuit includes a segmented resonator group including a first acoustic wave resonator and a second acoustic wave resonator, the first acoustic wave resonator and the second acoustic wave resonator being connected in series to one another, the IDT electrode included in the first acoustic wave resonator includes a first withdrawal electrode, the IDT electrode included in the second acoustic wave resonator includes a second withdrawal electrode, and $C1/r1 > C2/r2$ and $r1 < r2$ are satisfied where $C1$ is a capacitance of the IDT electrode included in the first acoustic wave resonator, $C2$ is a capacitance of the IDT electrode included in the second acoustic wave resonator, $r1$ is a withdrawal ratio of the IDT electrode included in the first acoustic wave resonator, and $r2$ is a withdrawal ratio of the IDT electrode included in the second acoustic wave resonator.

An acoustic wave filter according to a preferred embodiment of the present invention includes a first input/output terminal and a second input/output terminal, and at least one series arm resonator circuit in a path connecting the first input/output terminal and the second input/output terminal or at least one parallel arm resonator circuit each arranged between a node in the path and ground or both the at least one series arm resonator circuit and the at least one parallel arm resonator circuit, wherein each of the at least one series arm resonator circuit or each of the at least one parallel arm resonator circuit or each of both the at least one series arm resonator circuit and the at least one parallel arm resonator circuit includes an acoustic wave resonator including an IDT electrode provided on a substrate having piezoelectricity, a first series arm resonator circuit of the at least one series arm resonator circuit or a first parallel arm resonator circuit of the at least one parallel arm resonator circuit or both the first series arm resonator circuit and the first parallel arm resonator circuit each include a segmented resonator group made up of a first acoustic wave resonator and a second acoustic wave resonator, the first acoustic wave resonator and the second acoustic wave resonator being connected in series to one another, the IDT electrode included in the first acoustic wave resonator includes a first withdrawal electrode, the IDT electrode included in the second acoustic wave resonator includes a second withdrawal electrode, and a product of the number of electrode fingers, an intersecting width, an electrode duty, and an electrode film thickness of the IDT electrode included in the first acoustic wave resonator is larger than a product of the number of electrode fingers, an intersecting width, an electrode duty, and an electrode film thickness of the IDT electrode included in the second acoustic wave resonator, and a withdrawal ratio of the IDT electrode included in the first acoustic wave resonator is smaller than a withdrawal ratio of the IDT electrode included in the second acoustic wave resonator.

Further, a multiplexer according to a preferred embodiment of the present invention includes a common terminal, an acoustic wave filter according to a preferred embodiment of the present invention, and a first filter including a third input/output terminal and a fourth input/output terminal, a pass band of the first filter being different from a pass band of the acoustic wave filter, wherein the common terminal is connected to the first input/output terminal and the third input/output terminal.

According to preferred embodiments of the present invention, it is possible to provide acoustic wave filters and multiplexers, in each of which the spurious emissions outside the pass band are reduced while securing low loss within the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
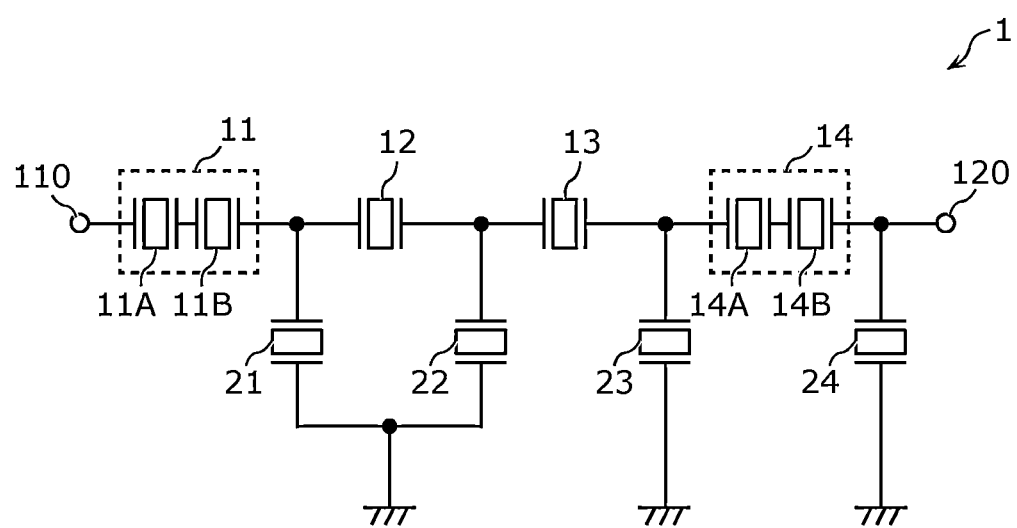
FIG. 1 is a circuit configuration diagram of an acoustic wave filter according to a preferred embodiment 1 of the present invention.

Hereinafter, preferred embodiments of the present invention will be described in detail with reference to the drawings. The preferred embodiments, which will be described below, each illustrate a comprehensive or specific example. Numeric values, shapes, materials, elements, arrangements and connection modes of the elements, and the like illustrated in the following preferred embodiments are mere examples, and not intended to limit the present invention. Of elements in the following working examples and modified examples, the elements that are not described in an independent claim will be described as optional elements. Further, dimensions or ratios of dimensions of elements illustrated in the drawings are not necessarily precise. In the respective drawings, the same reference characters denote the same or substantially the same elements, and in some cases, an overlapping description is omitted or simplified.

Further, in the present disclosure, terms indicating relationships among elements such as "parallel", "vertical", and the like and terms indicating shapes of constituent elements such as "rectangle" and the like are used not only to represent their precise meanings but also means to include their substantially equivalent ranges, for example, differences of about few %.

Further, in the present disclosure, the phrase "being connected" means to include not only the case of being directly connected via a connection terminal and/or a wiring conductor but also to include the case of being electrically connected via another circuit element. Further, the phrase "being connected in between A and B" and the phrase "being connected between A and B" mean to be connected to both A and B in a path that connects A and B.

Further, in the present disclosure, the "path" means a transmission line including a wiring line through which a radio frequency signal propagates, an electrode directly connected to this wiring line, a terminal directly connected to this wiring line or this electrode, and the like.

Preferred Embodiment 1

1.1 Circuit Configuration of Acoustic Wave Filter 1

FIG. 1 is a circuit configuration diagram of an acoustic wave filter 1 according to preferred embodiment 1 of the present invention. As illustrated in FIG. 1, the acoustic wave filter 1 includes segmented resonator groups 11 and 14, series arm resonators 12 and 13, parallel arm resonators 21, 22, 23, and 24, and input/output terminals 110 and 120.

The series arm resonators 12 and 13 are each one example of a series arm resonator circuit, are arranged in a path that connects the input/output terminal 110 (first input/output terminal) and the input/output terminal 120 (second input/output terminal), and are connected to each other in series. Further, each of the series arm resonators 21 to 24 is one example of a parallel arm resonator circuit and is arranged between a node in the foregoing path and a ground terminal.

The segmented resonator group 11 is one example of a first series arm resonator circuit, which is one of the series arm resonator circuits, is arranged in the path connecting the input/output terminal 110 and the input/output terminal 120, and is connected in series to the series arm resonators 12 and 13 and the segmented resonator group 14. The segmented resonator group 11 includes segmented resonators 11A and 11B that are connected to each other in series (cascade-connected). The segmented resonator 11A is one example of a first acoustic wave resonator, and the segmented resonator 11B is one example of a second acoustic wave resonator.

The segmented resonator group 14 is one example of the series arm resonator circuit, is arranged in the path connecting the input/output terminal 110 and the input/output terminal 120, and is connected in series to the series arm resonators 12 and 13 and the segmented resonator group 11. The segmented resonator group 14 includes segmented resonators 14A and 14B that are connected to each other in series (cascade-connected).

Each of the series arm resonators 12 and 13, the segmented resonators 11A, 11B, 14A, and 14B, and the parallel arm resonators 21 to 24 is an acoustic wave resonator including an IDT electrode provided on a substrate having piezoelectricity.

An IDT electrode included in the first acoustic wave resonator includes one or more first withdrawal electrodes, and an IDT electrode included in the second acoustic wave resonator includes one or more second withdrawal electrodes.

The segmented resonator group is defined as a resonator circuit including a plurality of acoustic wave resonators that are connected to each other in series and has the configuration in which no circuit element other than the plurality of acoustic wave resonators nor ground is connected to connection nodes that connect the plurality of acoustic wave resonators. Further, electrode parameters of a plurality of the segmented resonators included in the segmented resonator group may vary from segmented resonator to segmented resonator.

According to the arrangement of the segmented resonator groups 11 and 14, it becomes possible to improve electric power handling capability and reduce or prevent intermodulation distortion of the acoustic wave filter 1. By providing a single acoustic wave resonator having capacitive impedance from two segmented resonators connected in series, it becomes possible to provide a large area of the IDT electrode. Because of this, it becomes possible to reduce the current density of the foregoing two segmented resonators compared with the current density of the foregoing single acoustic wave resonator, and thus it becomes possible to achieve the improvement of electric power handling capability and the reduction or prevention of intermodulation distortion of the acoustic wave filter 1.

The segmented resonator group 14 may alternatively be a series arm resonator including a single acoustic wave resonator, and further, each of the series arm resonators 12 and 13 may alternatively be a segmented resonator group.

Further, alternatively, each of the segmented resonator groups 11 and 14 may be a series arm resonator including a single acoustic wave resonator, and at least one of the parallel arm resonators 21 to 24 may be a segmented resonator group including the first acoustic wave resonator and the second acoustic wave resonator. In this case, the foregoing at least one of the parallel arm resonators 21 to 24 is one example of a first parallel arm resonator circuit, which is one of the parallel arm resonator circuits.

Still alternatively, at least one of the segmented resonator groups 11 and 14 and the series arm resonators 12 and 13 may be a segmented resonator group including the first acoustic wave resonator and the second acoustic wave resonator, and at least one of the parallel arm resonators 21 to 24 may be a segmented resonator group including the first acoustic wave resonator and the second acoustic wave resonator. In this case, the foregoing at least one of the segmented resonator groups 11 and 14 and the series arm resonators 12 and 13 is one example of the first series arm resonator circuit, which is one of the series arm resonator circuits, and the foregoing at least one of the parallel arm resonators 21 to 24 is one example of the first parallel arm resonator circuit, which is one of the parallel arm resonator circuits.

That is to say, the segmented resonator group including the first acoustic wave resonator and the second acoustic wave resonator may be arranged in at least one resonator circuit of at least one series arm resonator circuit and at least one parallel arm resonator circuit, and the number of segmented resonator groups to be arranged may be one or more.

Further, a circuit element such as an inductor, a capacitor or the like may be inserted between the segmented resonator groups 11 and 14, the series arm resonators 12 and 13, the parallel arm resonators 21 to 24, and the input/output terminals 110 and 120, and between the parallel arm resonators 21 to 24 and the ground.

Further, the acoustic wave filter 1 according to the present preferred embodiment may only need to include the at least one series arm resonator circuit or the at least one parallel arm resonator circuit or both.

The acoustic wave filter 1 according to the present preferred embodiment may be, for example, a ladder acoustic wave filter that includes the at least one series arm resonator circuit and the at least one parallel arm resonator circuit.

Alternatively, the acoustic wave filter 1 according to the present preferred embodiment may be, for example, an acoustic wave filter that includes the at least one series arm resonator circuit and a longitudinally coupled type resonator or the at least one parallel arm resonator circuit and the longitudinally coupled type resonator or the at least one series arm resonator circuit, the at least one parallel arm resonator circuit, and the longitudinally coupled type resonator.

In the following section, a basic structure of the series arm resonator circuit and the parallel arm resonator circuit included in the acoustic wave filter 1 is described.

1.2 Structure of Acoustic Wave Resonator

Figure 2A:
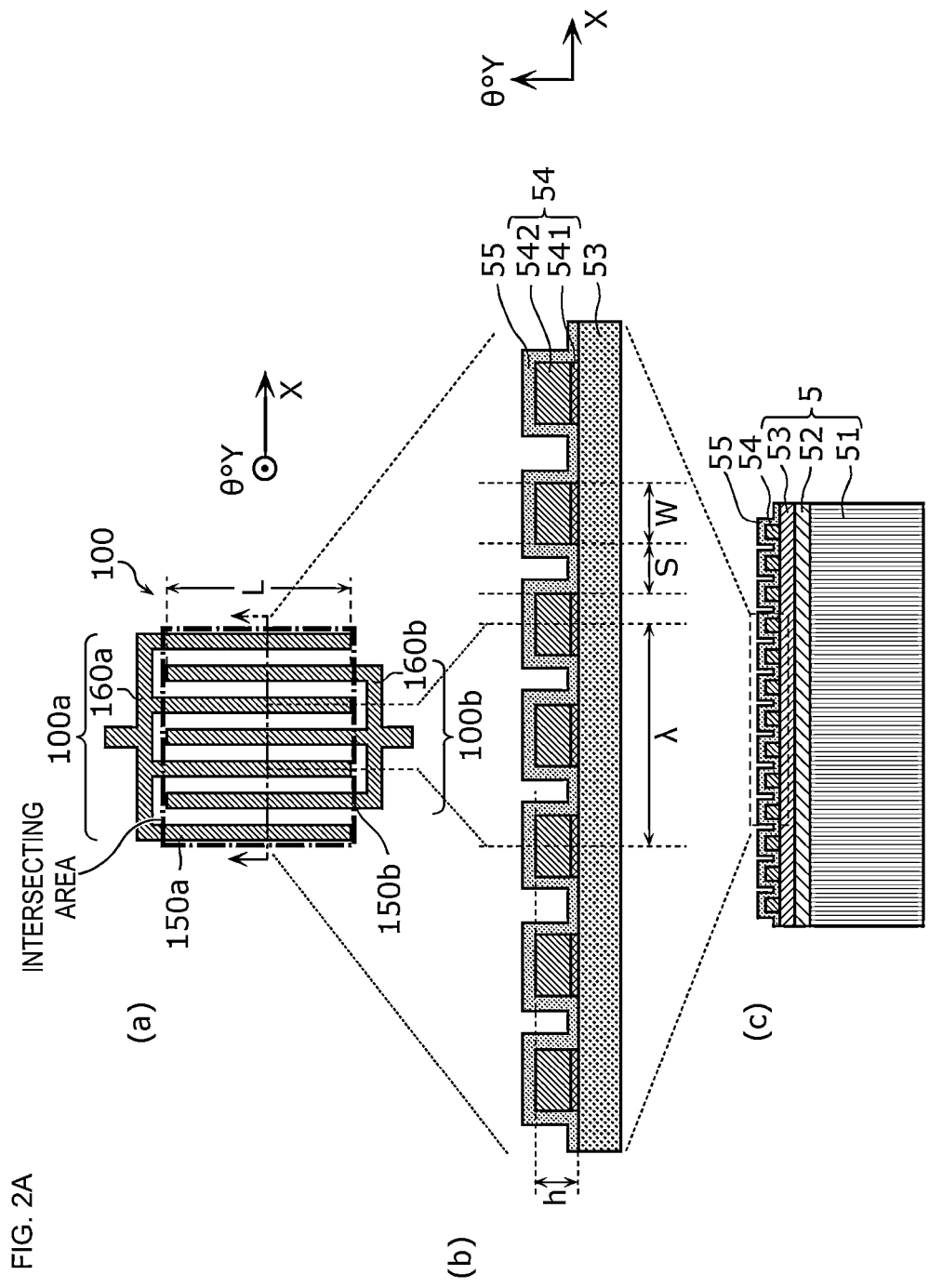
FIG. 2A illustrates a plan view and cross-sectional views schematically illustrating one example of an acoustic wave resonator according to preferred embodiment 1 of the present invention.

FIG. 2A illustrates outline views schematically illustrating one example of an acoustic wave resonator according to preferred embodiment 1. In FIG. 2A, (a) is a plan view, and (b) and (c) are cross-sectional views at the dashed-dotted line indicated in (a). FIG. 2A illustrates an exemplification of an acoustic wave resonator 100 that has a basic structure of the series arm resonators, the parallel arm resonators, and the segmented resonators included in the acoustic wave filter 1. The acoustic wave resonator 100 illustrated in FIG. 2A is for illustrating a typical structure of the acoustic wave resonator, and the number, the length, and the like of the electrode fingers included in the electrode are not limited thereto.

The acoustic wave resonator 100 includes a substrate 5 having piezoelectricity and comb-shaped electrodes 100a and 100b.

As illustrated in (a) of FIG. 2A, a pair of the comb-shaped electrodes 100a and 100b, which are arranged opposite each other, are provided on the substrate 5. The comb-shaped electrode 100a includes a plurality of electrode fingers 150a that are parallel or substantially parallel to each other and a busbar electrode 160a that connects the plurality of electrode fingers 150a. The comb-shaped electrode 100b includes a plurality of electrode fingers 150b that are parallel or substantially parallel to each other and a busbar electrode 160b that connects the plurality of electrode fingers 150b. The plurality of electrode fingers 150a and the plurality of electrode fingers 150b are provided so as to extend in a direction orthogonal or substantially orthogonal to an acoustic wave propagation direction (X axis direction).

Further, the IDT electrode 54 including the plurality of electrode fingers 150a, the plurality of electrode fingers 150b, and the busbar electrodes 160a and 160b has a multilayer structure including a close contact layer 541 and a primary electrode layer 542, as illustrated in (b) of FIG. 2A.

The close contact layer 541 is a layer to improve adhesiveness between the substrate 5 and the primary electrode layer 542, and as a material therefor, for example, Ti is used.

As a material for the primary electrode layer 542, for example, Al including about 1% of Cu is used.

A protective layer 55 covers the comb-shaped electrodes 100a and 100b. The protective layer 55 is a layer whose purpose is to protect the primary electrode layer 542 from an external environment, adjust a frequency-temperature characteristic, and improve a moisture resistance property and is, for example, a dielectric film whose main component is silicon dioxide.

The materials of the close contact layer 541, the primary electrode layer 542, and the protective layer 55 are not limited to the ones described above. Moreover, the IDT electrode 54 does not necessarily need to have the foregoing multilayer structure. The IDT electrode 54 may include, for example, a metal such as Ti, Al, Cu, Pt, Au, Ag, Pd, or the like or an alloy thereof, or may include a plurality of multilayer bodies each composed of the metal or the alloy described above. Further, the protective layer 55 does not necessarily need to be provided.

Next, a multilayer structure of the substrate 5 is described.

As illustrated in (c) of FIG. 2A, the substrate 5 includes a high acoustic velocity support substrate 51, a low acoustic velocity film 52, and a piezoelectric film 53, and has a structure in which the high acoustic velocity support substrate 51, the low acoustic velocity film 52, and the piezoelectric film 53 are stacked on top of each other in this order.

The piezoelectric film 53 includes, for example, θ° Y-cut X-propagation LiTaO$_3$ piezoelectric single crystal or a piezoelectric ceramic (lithium tantalate single crystal that is cut at a surface whose normal line is an axis obtained by rotating from the Y axis by θ° about the X axis that serves as the center axis or a ceramic, in which a surface acoustic wave propagates in the X axis direction). Depending on a requirement specification of the acoustic wave filter 1, the material and the cut angle of the piezoelectric single crystal to be used as the piezoelectric film 53 are appropriately selected.

The high acoustic velocity support substrate 51 is a substrate that supports the low acoustic velocity film 52, the piezoelectric film 53, and the IDT electrode 54. Moreover, the high acoustic velocity support substrate 51 is a substrate such that the acoustic velocity of a bulk wave in the high acoustic velocity support substrate 51 is higher than the acoustic velocities of acoustic waves such as a surface wave, a boundary wave, and the like propagating through the piezoelectric film 53, and functions to confine a surface acoustic wave in a portion where the piezoelectric film 53 and the low acoustic velocity film 52 are stacked on top of each other and prevent the surface acoustic wave from leaking downward below the high acoustic velocity support substrate 51. The high acoustic velocity support substrate 51 is, for example, a silicon substrate.

The low acoustic velocity film 52 is a film such that the acoustic velocity of a bulk wave in the low acoustic velocity film 52 is lower than the acoustic velocity of a bulk wave propagating through the piezoelectric film 53 and is arranged between the piezoelectric film 53 and the high acoustic velocity support substrate 51. According to this structure and the property that energy is focused in a medium where the acoustic velocity of an acoustic wave is inherently low, the leakage of surface acoustic wave energy to outside the IDT electrode is reduced or prevented. The low acoustic velocity film 52 is, for example, a film whose main component is silicon dioxide.

According to the foregoing multilayer structure of the substrate 5, compared with a prior art structure in which a single layer of piezoelectric substrate is used, it becomes possible to substantially increase the Q factor at a resonant frequency and an anti-resonant frequency. Because a high Q factor acoustic wave resonator can be provided, it becomes possible to provide a filter having a low insertion loss using this acoustic wave resonator.

Further, in the case where a withdrawal electrode is used in the acoustic wave resonator 100 to improve the steepness in the end portion of the pass band of the acoustic wave filter 1, which will be described below, the Q factor of the acoustic wave resonator 100 is expected to decrease equivalently in some cases. In contrast, with the foregoing multilayer structure of the substrate, a high Q factor of the acoustic wave resonator 100 can be maintained. Accordingly, it becomes possible to provide the acoustic wave filter 1 in which low loss within the pass band is maintained.

The high acoustic velocity support substrate 51 may alternatively have a structure in which a support substrate and a high acoustic velocity film are stacked on top of each other, and the high acoustic velocity film is such that the acoustic velocity of a bulk wave propagating through the high acoustic velocity film is higher than the acoustic velocities of acoustic waves such as a surface wave, a boundary wave, and the like propagating through the piezoelectric film 53. In this case, as the support substrate, a piezoelectric body such as, for example, sapphire, lithium tantalate, lithium niobite, crystal, or the like, various ceramics such as alumina, magnesia, silicon nitride, aluminum nitride, silicon carbide, zirconia, cordierite, mullite, steatite, forsterite, or the like, a dielectric body such as glass or the like, a semiconductor such as silicon, gallium nitride, or the like, a resin substrate, or the like can be used. Further, for the high acoustic velocity film, various high acoustic velocity materials such as, aluminum nitride, aluminum oxide, silicon carbide, silicon nitride, silicon oxynitride, a DLC film, diamond, a medium whose main component is one of these materials, a medium whose main component is a mixture of these materials, or the like can be used.

Figure 2B:
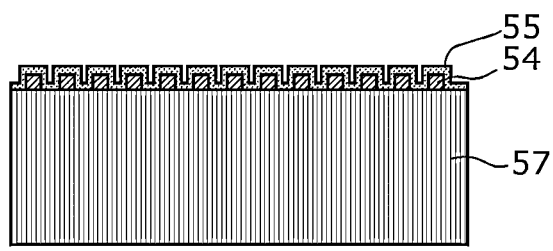
FIG. 2B is a cross-sectional view schematically illustrating an acoustic wave resonator according to a modified example of preferred embodiment 1 of the present invention.

Further, FIG. 2B is a cross-sectional view schematically illustrating an acoustic wave resonator according to a modified example of preferred embodiment 1. In the acoustic wave resonator 100 illustrated in FIG. 2A, the example in which the IDT electrode 54 is provided on the substrate 5 including the piezoelectric film 53 is illustrated. In contrast, in the acoustic wave resonator illustrated in FIG. 2B, the substrate on which the IDT electrode 54 is provided may be a piezoelectric single crystal substrate 57 including a single layer of piezoelectric layer. The piezoelectric single crystal substrate 57, for example, includes piezoelectric single crystal of LiNbO$_3$. The acoustic wave resonator 100 according to the present modified example includes, for example, the piezoelectric single crystal substrate 57 of LiNbO$_3$, the IDT electrode 54, and the protective layer 55 on the piezoelectric single crystal substrate 57 and the IDT electrode 54.

Depending on required bandpass characteristics of the acoustic wave filter 1 or the like, the multilayer structures, the materials, the cut angles, or the thicknesses of the piezoelectric film 53 and the piezoelectric single crystal substrate 57, which are described above, may be changed if appropriate. Advantageous effects the same as or similar to those of the acoustic wave resonator 100 that uses the piezoelectric film 53 described above can be produced even with the acoustic wave resonator 100 that uses a LiTaO$_3$ piezoelectric substrate having a cut angle different from the cut angle described above or any similar substrate.

Further, the substrate on which the IDT electrode 54 is provided may alternatively have a structure in which a support substrate, an energy confinement layer, and a piezoelectric film are stacked on top of each other in this order. On the piezoelectric film, the IDT electrode 54 is provided. For the piezoelectric film, for example, LiTaO$_3$ piezoelectric single crystal or a piezoelectric ceramic is used. The support substrate is a substrate that supports the piezoelectric film, the energy confinement layer, and the IDT electrode 54.

The energy confinement layer includes a single layer or a plurality of layers, and the velocity of an acoustic bulk wave propagating through at least one of these layers is greater than the velocity of an acoustic wave propagating in the vicinity of the piezoelectric film. For example, the energy confinement layer may have a multilayer structure including a low acoustic velocity layer and a high acoustic velocity layer. The low acoustic velocity layer is a film such that the acoustic velocity of a bulk wave propagating through the low acoustic velocity layer is lower than the acoustic velocity of an acoustic wave propagating through the piezoelectric film. The high acoustic velocity layer is a film such that the acoustic velocity of a bulk wave propagating through the high acoustic velocity layer is higher than the acoustic velocity of an acoustic wave propagating through the piezoelectric film. The support substrate may be defined by the high acoustic velocity layer.

Further, the energy confinement layer may be an acoustic impedance layer having a configuration in which a low acoustic impedance layer whose acoustic impedance is relatively low and a high acoustic impedance layer whose acoustic impedance is relatively high are stacked on top of each other in an alternating fashion.

Here, exemplary electrode parameters of the IDT electrode included in the acoustic wave resonator 100 are described.

The wavelength of an acoustic wave resonator is specified by a wavelength λ, which is a repetition period of the plurality of electrode fingers 150a or the plurality of electrode fingers 150b included in the IDT electrode 54 illustrated in (b) of FIG. 2A. Further, the electrode pitch is about ½ of the wavelength λ and is defined by (W+S), where W is the line width of the electrode fingers 150a and 150b included in the comb-shaped electrodes 100a and 100b, and S is the space width between the electrode finger 150a and the electrode finger 150b that are adjacent to each other. Further, as illustrated in (a) of FIG. 2A, the intersecting width L of a pair of the comb-shaped electrodes 100a and 100b is the overlapping length of electrode fingers when seen from the acoustic wave propagation direction (X axis direction) of the electrode finger 150a and the electrode finger 150b. Further, the number of pairs M (pairs) of the IDT electrode 54 is defined as (P−1)/2 where P (number) is the total number of the electrode fingers 150a and the electrode fingers 150b. Further, the electrode duty D of each acoustic wave resonator is a line width share of the plurality of electrode fingers 150a and the plurality of electrode fingers 150b and is defined as W/(W+S), which is a ratio of the line width for the plurality of electrode fingers 150a and the plurality of electrode fingers 150b to the sum of this line width and the space width. Further, h is the height (electrode film thickness) of the comb-shaped electrodes 100a and 100b. In the following, parameters relating to the shape of IDT electrode of an acoustic wave resonator, such as the wavelength λ, the intersecting width L, the electrode duty D, the electrode film thickness h of the IDT electrode 54, and the like, are defined as electrode parameters.

Further, the capacitance of the IDT electrode 54 is a capacitance provided in the intersecting area (see (a) of FIG. 2A) where the electrode fingers 150a and 150b of the two comb-shaped electrodes 100a and 100b, which define the IDT electrode 54, are arranged opposite each other.

Further, the capacitance of the IDT electrode 54 is proportional to the product of the number of electrode fingers P, the intersecting width L, the electrode duty D, and the electrode film thickness h of the IDT electrode 54. In the case where the electrode duty D and the electrode film thickness h are both constant, the electrode duty D and the electrode film thickness h can be ignored when the capacitances of the IDT electrodes are compared.

1.3 Electrode Finger Structure of Segmented Resonator

Figure 3A:
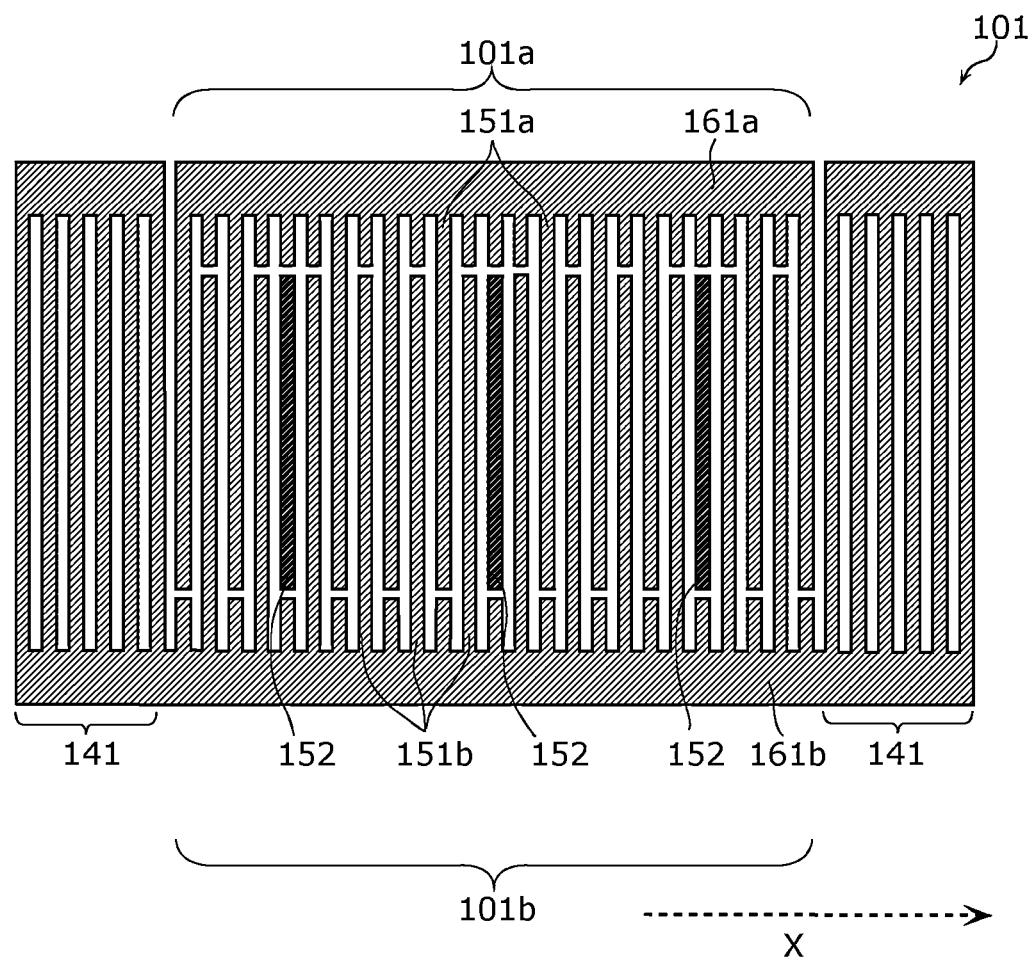
FIG. 3A is an outline plan view illustrating a configuration of an IDT electrode including floating withdrawal electrodes in an acoustic wave filter.
Figure 3B:
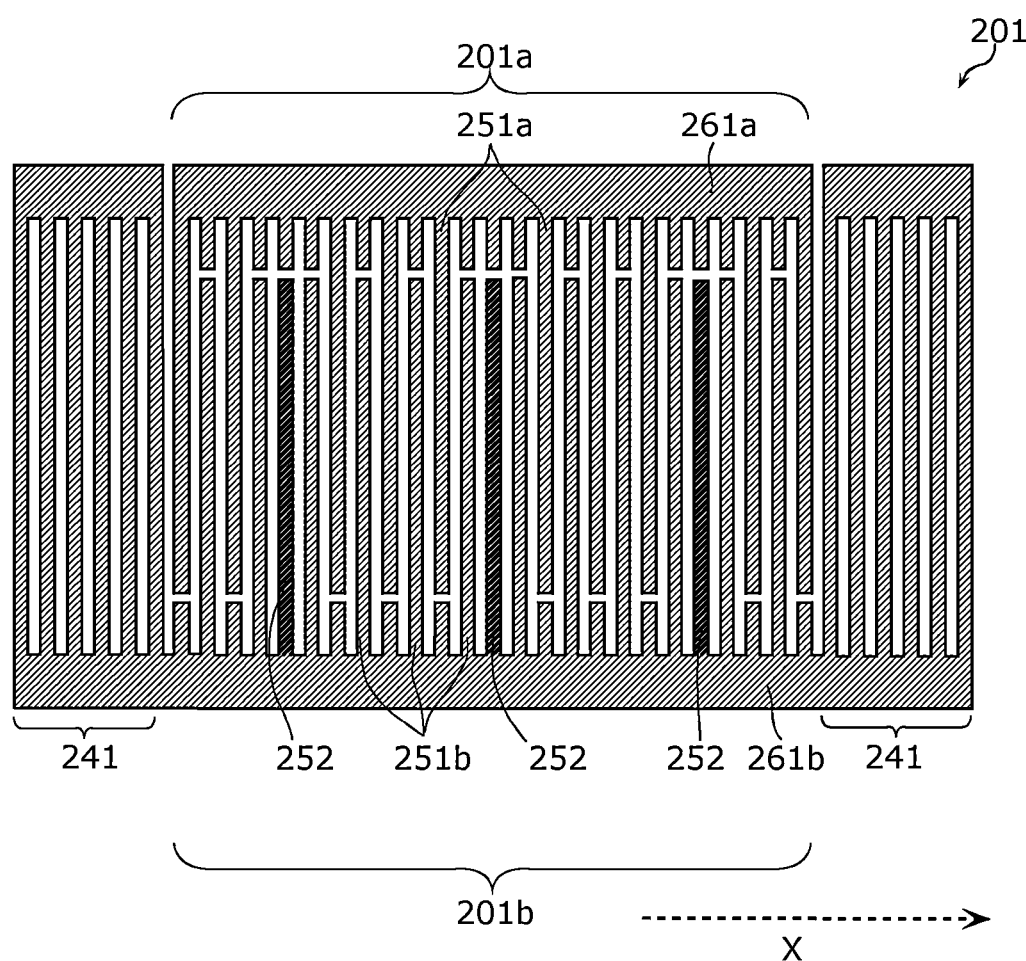
FIG. 3B is an outline plan view illustrating a configuration of an IDT electrode including reversed polarity withdrawal electrodes in an acoustic wave filter.
Figure 3C:
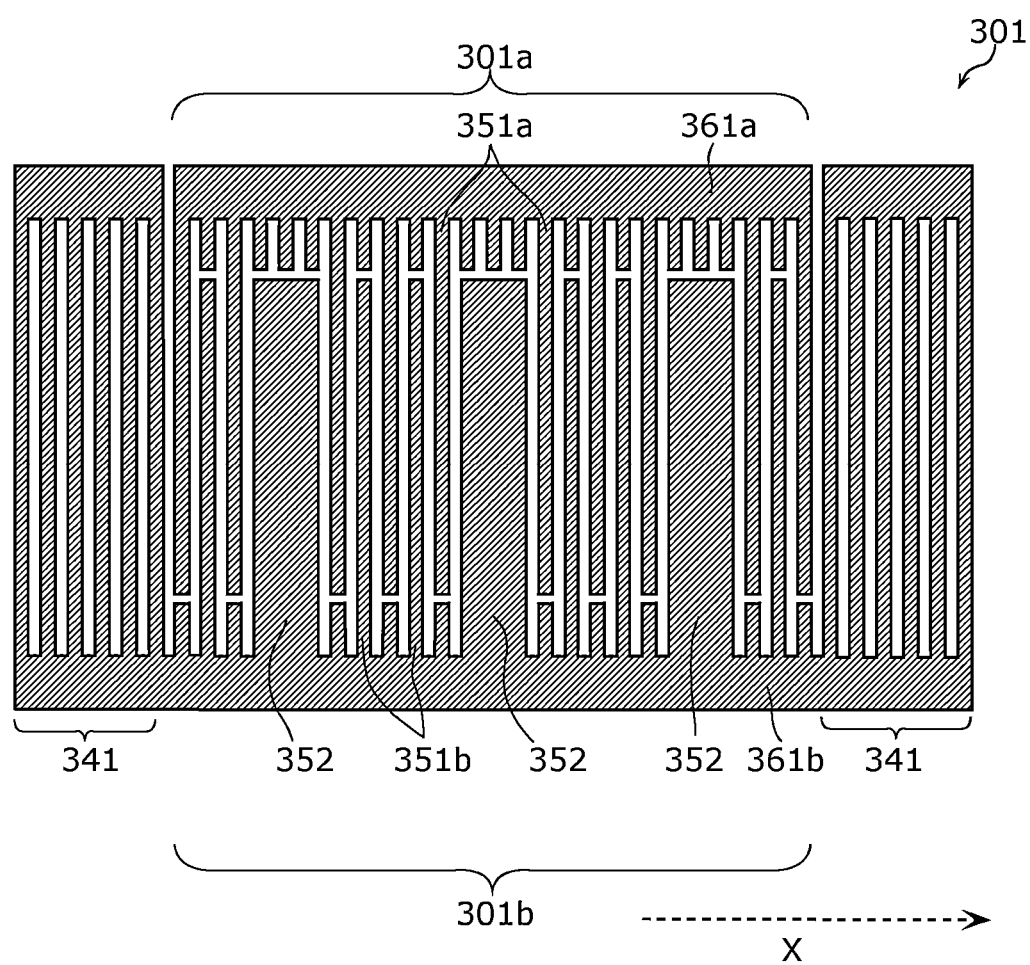
FIG. 3C is an outline plan view illustrating a configuration of an IDT electrode including filling withdrawal electrodes in an acoustic wave filter.

Next, using FIG. 3A to FIG. 3C, exemplary structures of withdrawal electrodes included in the segmented resonator are illustrated.

FIG. 3A is an outline plan view illustrating a configuration of an IDT electrode including floating withdrawal electrodes in an acoustic wave filter. FIG. 3B is an outline plan view illustrating a configuration of an IDT electrode including reversed polarity withdrawal electrodes in an acoustic wave filter. FIG. 3C is an outline plan view illustrating a configuration of an IDT electrode including filling withdrawal electrodes in an acoustic wave filter.

An acoustic wave resonator 101 illustrated in FIG. 3A is an exemplification of the electrode finger structure of the first withdrawal electrode or the second withdrawal electrode, and an example of a schematic plan view representing an IDT electrode structure of the acoustic wave resonator 101 is provided. The acoustic wave resonator 101 illustrated in FIG. 3A is for illustrating a typical structure of the first withdrawal electrode or the second withdrawal electrode, and the number, the length, and the like of the electrode fingers included in the electrode are not limited thereto.

The acoustic wave resonator 101 includes the substrate 5 having piezoelectricity, comb-shaped electrodes 101a and 101b provided on the substrate 5, and reflectors 141.

As illustrated in FIG. 3A, the comb-shaped electrode 101a includes a plurality of electrode fingers 151a that are parallel or substantially parallel to each other and a busbar electrode 161a that connects one-end portions of the plurality of electrode fingers 151a. Further, the comb-shaped electrode 101b includes a plurality of electrode fingers 151b that are parallel or substantially parallel to each other and a busbar electrode 161b that connects one-end portions of the plurality of electrode fingers 151b. The plurality of electrode fingers 151a and the plurality of electrode fingers 151b extend in a direction orthogonal or substantially orthogonal to the surface acoustic wave propagation direction (X axis direction). The comb-shaped electrodes 101a and 101b are arranged opposite each other such that the plurality of electrode fingers 151a and the plurality of electrode fingers 151b are interdigitated with each other. That is, the IDT electrode of the acoustic wave resonator 101 includes a pair of the comb-shaped electrodes 101a and 101b.

The comb-shaped electrode 101a includes dummy electrodes arranged to face a plurality of the electrode fingers 151b in the length direction thereof. However, the comb-shaped electrode 101a does not necessarily need to include these dummy electrodes. Further, the comb-shaped electrode 101b includes dummy electrodes arranged to face a plurality of the electrode fingers 151a in the length direction thereof. However, the comb-shaped electrode 101b does not necessarily need to include these dummy electrodes. Further, for example, the comb-shaped electrodes 101a and 101b may alternatively be a slanted IDT electrode in which the extending direction of the busbar electrode is slanted relative to the surface acoustic wave propagation direction or may alternatively have a piston structure.

The reflectors 141 each include a plurality of electrode fingers that are parallel or substantially parallel to each other and busbar electrodes that connect the plurality of electrode fingers and are arranged on two end sides of the pair of the comb-shaped electrodes 101a and 101b.

As illustrated in (b) of FIG. 2A, the IDT electrode including the pair of the comb-shaped electrodes 101a and 101b has a multilayer structure including the close contact layer 541 and the primary electrode layer 542. However, the structure of the IDT electrode is not limited to this multilayer structure.

Here, in the IDT electrode of the acoustic wave resonator 101, the electrode fingers 152 are separated from each other. The electrode finger 152 is the floating withdrawal electrodes that is not connected to any of the busbar electrodes 161a and 161b and is arranged in parallel or substantially in parallel to and with the same or substantially the same pitch as that of the plurality of electrode fingers 151a and the plurality of electrode fingers 151b. Further, a plurality of the electrode fingers 151a and a plurality of the electrode fingers 151b are arranged between two adjacent electrode fingers 152. That is, the pitch of the electrode fingers 152 is greater than the pitches of the plurality of the electrode fingers 151a and the plurality of the electrode fingers 151b.

Here, the withdrawal ratio of the IDT electrode including the floating withdrawal electrodes is defined. In the case where one electrode finger 152 is placed among N electrode fingers (total number of the electrode fingers 151a+the electrode fingers 151b+the electrode finger 152) which are continuously lined up in the X axis direction, the withdrawal ratio of the IDT electrode of the acoustic wave resonator 101 is expressed as 1/N. For example, in the case where the ratio of the number of the electrode finger 152 to the number of the electrode fingers lined up continuously in the X axis direction is about 1:10, the withdrawal ratio is about 10%, and in the case where the ratio of the number of the electrode finger 152 to the number of the electrode fingers lined up continuously in the X axis direction is about 1:20, the withdrawal ratio is about 5%.

An acoustic wave resonator 201 illustrated in FIG. 3B is an exemplification of the electrode finger structure of the first withdrawal electrode or the second withdrawal electrode, and an example of a schematic plan view representing an IDT electrode structure of the acoustic wave resonator 201 is provided. The acoustic wave resonator 201 illustrated in FIG. 3B is for illustrating a typical structure of the first withdrawal electrode or the second withdrawal electrode, and the number, the length, and the like of the electrode fingers included in the electrode are not limited thereto.

The acoustic wave resonator 201 includes the substrate 5 having piezoelectricity, comb-shaped electrodes 201a and 201b formed on the substrate 5, and reflectors 241.

As illustrated in FIG. 3B, the comb-shaped electrode 201a includes of a plurality of electrode fingers 251a that are parallel or substantially parallel to each other and a busbar electrode 261a that connects one-end portions of the plurality of electrode fingers 251a. Further, the comb-shaped electrode 201b includes a plurality of electrode fingers 251b that are parallel or substantially parallel to each other and a busbar electrode 261b that connects one-end portions of the plurality of electrode fingers 251b. The plurality of electrode fingers 251a and the plurality of electrode fingers 251b extend in a direction orthogonal or substantially orthogonal to the surface acoustic wave propagation direction (X axis direction). The comb-shaped electrodes 201a and 201b are arranged opposite each other such that the plurality of electrode fingers 251a and the plurality of electrode fingers 251b are interdigitated with each other. That is, the IDT electrode of the acoustic wave resonator 201 includes a pair of the comb-shaped electrodes 201a and 201b.

The comb-shaped electrode 201a includes dummy electrodes arranged to face a plurality of the electrode fingers 251b in the length direction thereof. However, the comb-shaped electrode 201a does not necessarily need to include these dummy electrodes. Further, the comb-shaped electrode 201b includes dummy electrodes arranged to face a plurality of the electrode fingers 251a in the length direction thereof. However, the comb-shaped electrode 201b does not necessarily need to include these dummy electrodes. Further, for example, the comb-shaped electrodes 201a and 201b may alternatively be a slanted IDT electrode in which the extending direction of the busbar electrode is slanted relative to the surface acoustic wave propagation direction or may alternatively have a piston structure.

The reflectors 241 each include a plurality of electrode fingers that are parallel or substantially parallel to each other and busbar electrodes that connect the plurality of electrode fingers, and are arranged on two end sides of the pair of the comb-shaped electrodes 201a and 201b.

As illustrated in (b) of FIG. 2A, the IDT electrode including the pair of the comb-shaped electrodes 201a and 201b has a multilayer structure including the close contact layer 541 and the primary electrode layer 542. However, the structure of the IDT electrode is not limited to this multilayer structure.

Here, in the IDT electrode of the acoustic wave resonator 201, the electrode fingers 252 are separated from each other. The electrode finger 252 is the reversed polarity withdrawal electrode that is, of all the electrode fingers included in the pair of the comb-shaped electrodes 201a and 201b, connected to the same busbar electrode to which the electrode fingers on both sides thereof are connected. Further, a plurality of the electrode fingers 251a and a plurality of the electrode fingers 251b are arranged between two adjacent electrode fingers 252. That is, the pitch of the electrode fingers 252 is greater than the pitches of the plurality of the electrode fingers 251a and the plurality of the electrode fingers 251b.

Here, the withdrawal ratio of the IDT electrode including the reversed polarity withdrawal electrodes is defined. In the case where one electrode finger 252 is provided among N electrode fingers (total number of the electrode fingers 251a+the electrode fingers 251b+the electrode finger 252) which are continuously lined up in the X axis direction, the withdrawal ratio of the IDT electrode of the acoustic wave resonator 201 is expressed as 1/N. For example, in the case where the ratio of the number of the electrode finger 252 to the number of the electrode fingers lined up continuously in the X axis direction is about 1:10, the withdrawal ratio is about 10%, and in the case where the ratio of the number of the electrode finger 252 to the number of the electrode fingers lined up continuously in the X axis direction is about 1:20, the withdrawal ratio is about 5%.

An acoustic wave resonator 301 illustrated in FIG. 3C is an exemplification of the electrode finger structure of the first withdrawal electrode or the second withdrawal electrode, and an example of a schematic plan view representing an IDT electrode structure of the acoustic wave resonator 301 is provided. The acoustic wave resonator 301 illustrated in FIG. 3C is for illustrating a typical structure of the first withdrawal electrode or the second withdrawal electrode, and the number, the length, and the like of the electrode fingers included in the electrode are not limited thereto.

The acoustic wave resonator 301 includes the substrate 5 having piezoelectricity, comb-shaped electrodes 301a and 301b provided on the substrate 5, and reflectors 341.

As illustrated in FIG. 3C, the comb-shaped electrode 301a includes a plurality of electrode fingers 351a that are parallel or substantially parallel to each other and a busbar electrode 361a that connects one-end portions of the plurality of electrode fingers 351a. Further, the comb-shaped electrode 301b includes a plurality of electrode fingers 351b that are parallel or substantially parallel to each other and a busbar electrode 361b that connects one-end portions of the plurality of electrode fingers 351b. The plurality of electrode fingers 351a and the plurality of electrode fingers 351b extend in a direction orthogonal or substantially orthogonal to the surface acoustic wave propagation direction (X axis direction). The comb-shaped electrodes 301a and 301b are arranged opposite each other in such a way that the plurality of electrode fingers 351a and the plurality of electrode fingers 351b interdigitate with each other. That is, the IDT electrode of the acoustic wave resonator 301 includes a pair of the comb-shaped electrodes 301a and 301b.

The comb-shaped electrode 301a includes dummy electrodes arranged to face a plurality of the electrode fingers 351b in the length direction thereof. However, the comb-shaped electrode 301a does not necessarily need to include these dummy electrodes. The comb-shaped electrode 301b includes dummy electrodes arranged to face a plurality of the electrode fingers 351a in the length direction thereof. However, the comb-shaped electrode 301b does not necessarily need to include these dummy electrodes. Further, the comb-shaped electrodes 301a and 301b may alternatively be a slanted IDT electrode in which the extending direction of the busbar electrode is slanted relative to the surface acoustic wave propagation direction or may alternatively have a piston structure.

The reflectors 341 each include a plurality of electrode fingers that are parallel or substantially parallel to each other and busbar electrodes that connect the plurality of electrode fingers and are arranged on two end sides of the pair of the comb-shaped electrodes 301a and 301b.

As illustrated in (b) of FIG. 2A, the IDT electrode including the pair of the comb-shaped electrodes 301a and 301b has a multilayer structure including the close contact layer 541 and the primary electrode layer 542. However, the structure of the IDT electrode is not limited to this multilayer structure.

Here, in the IDT electrode of the acoustic wave resonator 301, the electrode fingers 352 are separated from each other. The electrode finger 352 is a filling withdrawal electrode that is an electrode finger having the maximum electrode finger width in the IDT electrode of the acoustic wave resonator 301 and includes an electrode finger width wider than or equal to twice the average electrode finger width of the electrode fingers excluding the electrode finger 352. In other words, the electrode finger 352 is the filling withdrawal electrode having a wider electrode finger width than that of the plurality of electrode fingers 351a and the plurality of electrode fingers 351b, and is provided such that adjacent electrode fingers 351a and 351b and a space between these adjacent electrode fingers 351a and 351b are combined to define a single electrode finger (in FIG. 3C, equivalent to three electrode fingers including the electrode fingers 351a and 351b), and this resultant electrode finger is connected to one of the busbar electrodes 361a and 361b. Further, a plurality of the electrode fingers 351a and a plurality of the electrode fingers 351b are arranged between two adjacent electrode fingers 352. That is, the pitch of the electrode fingers 352 is greater than the pitches of the plurality of the electrode fingers 351a and the plurality of the electrode fingers 351b.

Here, the withdrawal ratio of the IDT electrode including the filling withdrawal electrodes is defined. In the case where one electrode finger 352 is provided among N electrode fingers (total number of the electrode fingers 351a+the electrode fingers 351b+the electrode finger 352 (counted as three electrode fingers)) which are continuously lined up in the X axis direction, the withdrawal ratio of the IDT electrode of the acoustic wave resonator 301 is expressed as 1/N. For example, in the case where the ratio of the number of the electrode finger 352 to the number of the electrode fingers lined up continuously in the X axis direction is about 1:10 (total number of 7 for the electrode fingers 351a and 351b+one for the electrode finger 352), the withdrawal ratio is about 10%, and in the case where the ratio of the number of the electrode finger 352 to the number of the electrode fingers lined up continuously in the X axis direction is about 1:20 (total number of 17 for the electrode fingers 351a and 351b+one for the electrode finger 352), the withdrawal ratio is about 5%.

In the acoustic wave filter 1 according to the present preferred embodiment, the first withdrawal electrodes included in the segmented resonators 11A and 14A may alternatively be any of the floating withdrawal electrode, the reversed polarity withdrawal electrode, and the filling withdrawal electrode. Further, the second withdrawal electrodes included in the segmented resonators 11B and 14B may alternatively be any of the floating withdrawal electrode, the reversed polarity withdrawal electrode, and the filling withdrawal electrode. That is, the electrode finger structure of the first withdrawal electrode included in the segmented resonator 11A may be the same as or different from the electrode finger structure of the second withdrawal electrode included in the segmented resonator 11B. Further, the electrode finger structure of the first withdrawal electrode included in the segmented resonator 14A may be the same as or different from the electrode finger structure of the second withdrawal electrode included in the segmented resonator 14B.

In the acoustic wave filter 1, the IDT electrodes included in the series arm resonators 12 and 13 and the parallel arm resonators 21 to 24 may each include, for example, the floating withdrawal electrodes, the reversed polarity withdrawal electrodes, or the filling withdrawal electrodes.

Further, the withdrawal ratio of an IDT electrode including withdrawal electrodes, which are not limited to the foregoing floating withdrawal electrodes, reversed polarity withdrawal electrodes, or filling withdrawal electrodes, is now defined. In the case where one withdrawal electrode finger is provided among N electrode fingers that are continuously lined up in the X axis direction, the withdrawal ratio of the IDT electrode of the segmented resonator is expressed as 1/N. For example, in the case where the ratio of the number of the withdrawal electrode finger to the number of the electrode fingers lined up continuously in the X axis direction is about 1:10, the withdrawal ratio is about 10%, and in the case where the ratio of the number of the withdrawal electrode finger to the number of the electrode fingers lined up continuously in the X axis direction is about 1:20, the withdrawal ratio is about 5%.

1.4 Electrode Parameters and Reflection Characteristic of Segmented Resonator Group Next, the reflection characteristics of the segmented resonator group of the acoustic wave filter 1 according to preferred embodiment 1 and a segmented resonator group according to a comparative example are compared.

Figure 4A:
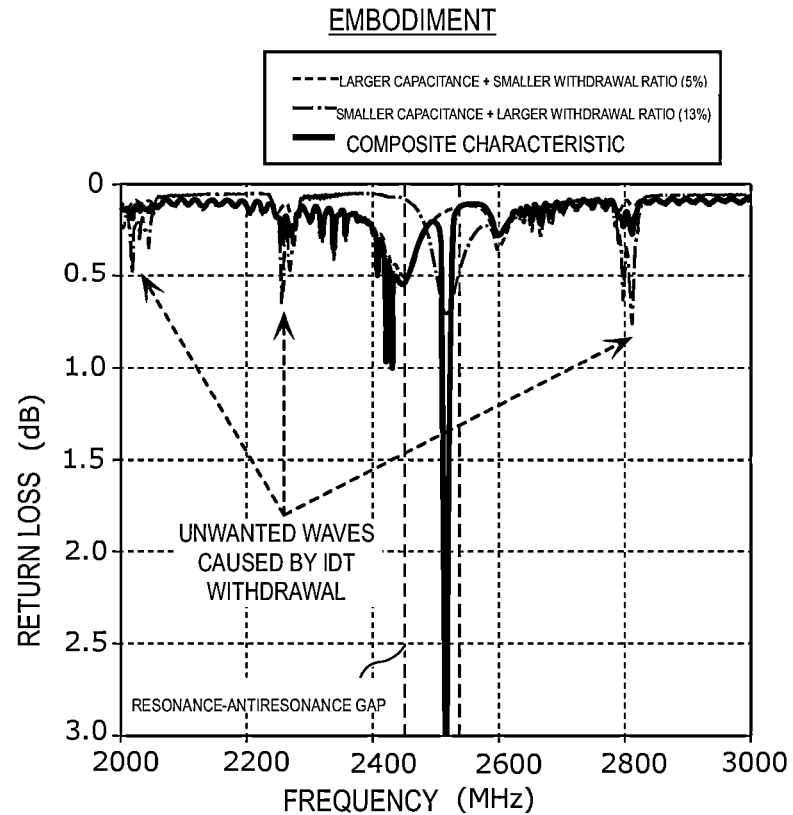
FIG. 4A is a graph illustrating a reflection characteristic of a segmented resonator group according to preferred embodiment 1 of the present invention.
Figure 4B:
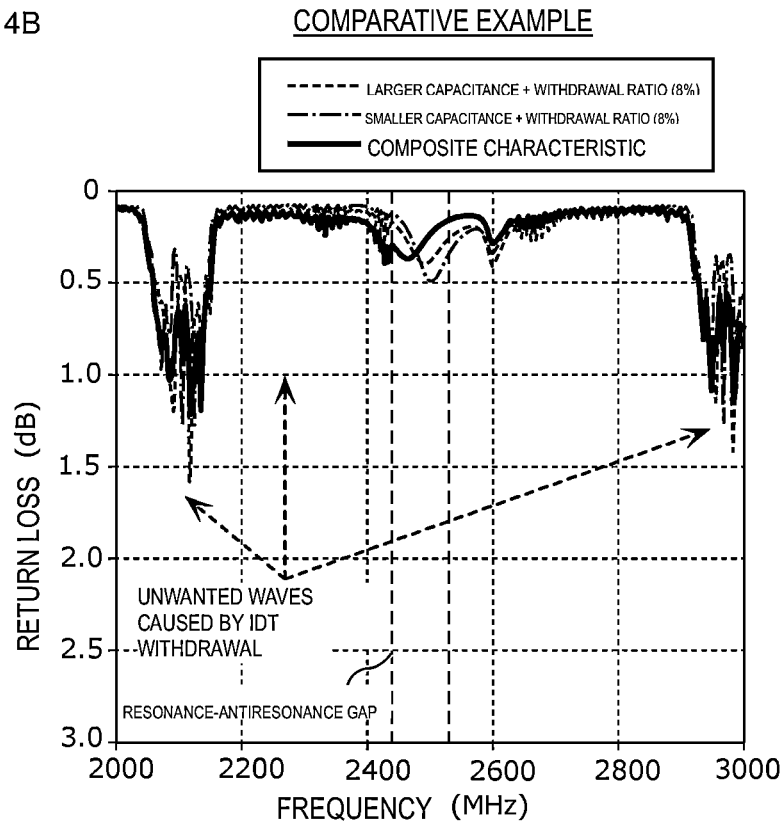
FIG. 4B is a graph illustrating the reflection characteristic of a segmented resonator group according to a comparative example.

FIG. 4A is a graph illustrating the reflection characteristic of the segmented resonator group 11 included in the acoustic wave filter 1 according to preferred embodiment 1. Further, FIG. 4B is a graph illustrating the reflection characteristic of a segmented resonator group according to a comparative example.

Compared with the acoustic wave filter 1 according to preferred embodiment 1, an acoustic wave filter according to the comparative example has the same or substantially the same connection configuration of the series arm resonator circuits and the parallel arm resonator circuits and is different only in electrode parameters of the segmented resonator group 11.

Table 1 illustrates exemplary electrode parameters of the segmented resonator group 11 included in the acoustic wave filter 1 according to preferred embodiment 1 and a segmented resonator group 11 included in the acoustic wave filter according to the comparative example.

TABLE 1

|  |  | Segmented Resonator 11A | Segmented Resonator 11B |
|---|---|---|---|
| Preferred embodiment 1 Acoustic wave Filter 1 | Number of Electrode Fingers | 241 | 161 |
|  | Intersecting Width (μm) | 30.5 | 30.5 |
|  | Withdrawal Ratio (%) | 5.0 | 13.0 |
| Comparative Example Acoustic wave Filter | Number of Electrode Fingers | 241 | 161 |
|  | Intersecting Width (μm) | 30.5 | 30.5 |
|  | Withdrawal Ratio (%) | 8.0 | 8.0 |

As described in Table 1, in the acoustic wave filter 1 according to preferred embodiment 1, the product of the number of electrode fingers and the intersecting width of the IDT electrode included in the segmented resonator 11A is larger than the product of the number of electrode fingers and the intersecting width of the IDT electrode included in the segmented resonator 11B, and the withdrawal ratio of the IDT electrode of the segmented resonator 11A (first withdrawal ratio) is smaller than the withdrawal ratio of the IDT electrode of the segmented resonator 11B (second withdrawal ratio).

On the other hand, in the acoustic wave filter according to the comparative example, the product of the number of electrode fingers and the intersecting width of the IDT electrode included in the segmented resonator 11B is larger than the product of the number of electrode fingers and the intersecting width of the IDT electrode included in the segmented resonator 11A, and the withdrawal ratio of the IDT electrode of the segmented resonator 11A is equal to the withdrawal ratio of the IDT electrode of the segmented resonator 11B.

Here, a relationship between the level of spurious emissions generated outside a pass band of an acoustic wave filter and the electrode parameter of an acoustic wave resonator is described.

Figure 5A:
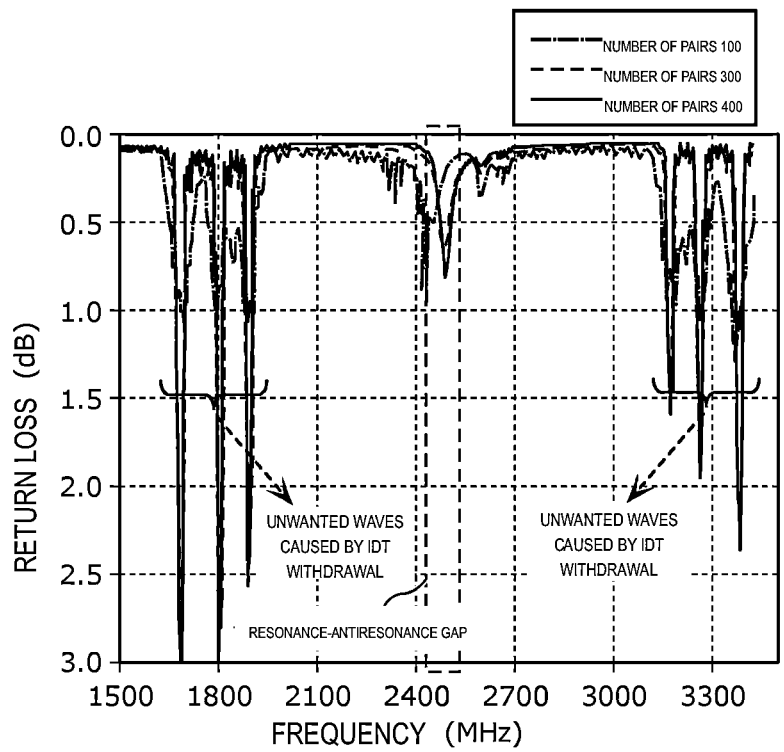
FIG. 5A illustrates a graph illustrating reflection characteristics when the number of pairs of an acoustic wave resonator is varied.

FIG. 5A is a graph illustrating the reflection characteristics when the number of pairs of an acoustic wave resonator is varied. FIG. 5A illustrates the reflection characteristics when the number of pairs M (=(the number of electrode fingers P−1)/2) is varied while keeping the intersecting width L of the acoustic wave resonator at a constant value (for example, about 25.48 μm). As illustrated in FIG. 5A, it was discovered that as the number of pairs M (=(the number of electrode fingers P−1)/2) increases, although generation frequencies of spurious emissions (unwanted waves caused by IDT withdrawal) do not change, the level of spurious emissions increases.

Figure 5B:
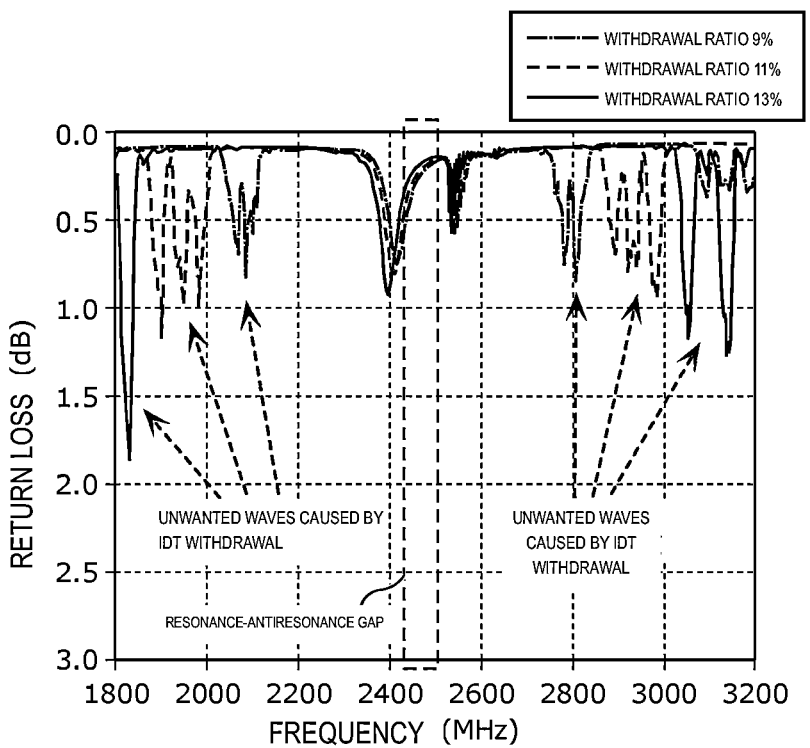
FIG. 5B illustrates a graph illustrating the reflection characteristics when the withdrawal ratio of an acoustic wave resonator is varied.

FIG. 5B is a graph illustrating the reflection characteristics when the withdrawal ratio of the acoustic wave resonator is varied. FIG. 5B illustrates the reflection characteristics when the withdrawal ratio is varied while keeping each of the intersecting width L and the number of pairs M (=(the number of electrode fingers P−1)/2) of the acoustic wave resonator at a constant value. As illustrated in FIG. 5B, it was discovered that as the withdrawal ratio increases, generation frequencies of spurious emissions (unwanted waves caused by IDT withdrawal) move away from the pass band, and the level of spurious emissions increases.

To improve the steepness in the vicinity of the pass band of an acoustic wave filter, the withdrawal electrode is used in the IDT electrode of the acoustic wave resonator included in the acoustic wave filter. However, as illustrated in FIG. 5A and FIG. 5B, as the withdrawal ratio of the IDT electrode increases or as the IDT electrode size, which is defined as the intersecting width L×the number of electrode fingers P, increases, the level of unwanted waves (spurious emissions) generated outside the pass band increases.

In contrast, in the acoustic wave filter 1 according to the present preferred embodiment, the level of spurious emissions outside the pass band is reduced by varying (dispersing) the withdrawal ratio for each of two segmented resonators included in the segmented resonator group 11, which are the segmented resonators 11A and 11B. As illustrated in FIG. 4B, in the acoustic wave filter according to the comparative example, the withdrawal ratios of the segmented resonators 11A and 11B are set to the same value. Thus, spurious generation frequencies coincide, and the level of spurious emissions increases.

Further, in the acoustic wave filter 1 according to the present preferred embodiment, the IDT electrode size (the intersecting width L×the number of electrode fingers P) of the segmented resonator 11B is relatively reduced to reduce the level of spurious emissions of the segmented resonator 11B whose withdrawal ratio is higher. Moreover, to obtain a required capacitance for a favorable bandpass characteristic within the pass band of the acoustic wave filter 1, the IDT electrode size (the intersecting width L×the number of electrode fingers P) of the segmented resonator 11A whose withdrawal ratio is lower is relatively increased. Because of this, as illustrated in FIG. 4A, it becomes possible to improve the reflection characteristic outside the pass band and reduce the level of spurious emissions while ensuring low loss within the pass band and steepness from both end portions of the pass band to attenuation bands by varying (dispersing) generation frequencies of spurious emissions generated outside the pass band. Moreover, with two segmented resonators that are connected in series (cascading connection), it becomes possible to improve the electric power handling capability.

In the acoustic wave filter 1 according to the present preferred embodiment and the acoustic wave filter according to the comparative example, the segmented resonators 11A and 11B are provided on the same piezoelectric substrate and have the same or substantially the same electrode film thickness h and the same or substantially the same electrode duty D. From this viewpoint, the product of the number of electrode fingers P and the intersecting width L of the IDT electrode can represent a relative capacitance of each of the segmented resonators 11A and 11B. Accordingly, the magnitude relationship of the product of the number of electrode fingers P and the intersecting width L of the IDT electrode can be viewed as the magnitude relationship of the capacitance of the IDT electrode.

That is to say, in the acoustic wave filter 1 according to preferred embodiment 1, the product of the number of electrode fingers, the intersecting width, the electrode duty, and the electrode film thickness of the IDT electrode included in the segmented resonator 11A is larger than the product of the number of electrode fingers, the intersecting width, the electrode duty, and the electrode film thickness of the IDT electrode included in the segmented resonator 11B, and further the withdrawal ratio of the IDT electrode of the segmented resonator 11A (first withdrawal ratio) is smaller than the withdrawal ratio of the IDT electrode of the segmented resonator 11B (second withdrawal ratio). On the other hand, in the acoustic wave filter according to the comparative example, the product of the number of electrode fingers, the intersecting width, the electrode duty, and the electrode film thickness of the IDT electrode included in the segmented resonator 11A is larger than the product of the number of electrode fingers, the intersecting width, the electrode duty, and the electrode film thickness of the IDT electrode included in the segmented resonator 11B, and the withdrawal ratio of the IDT electrode of the segmented resonator 11A is equal or substantially equal to the withdrawal ratio of the IDT electrode of the segmented resonator 11B.

Because of this, it becomes possible to improve the reflection characteristic outside the pass band and reduce the level of spurious emissions while ensuring low loss within the pass band and steepness from both end portions of the pass band to attenuation bands by varying (dispersing) generation frequencies of spurious emissions generated outside the pass band. Moreover, with two segmented resonators that are connected in series (cascading connection), it becomes possible to improve the electric power handling capability.

In the IDT electrode, the product of the number of electrode fingers, the intersecting width, the electrode duty, and the electrode film thickness is a value reflecting the capacitance of the IDT electrode in which no withdrawal electrode is provided. From this viewpoint, by using the capacitance of the IDT electrode, the foregoing characteristic features can be specified as follows.

In the acoustic wave filter 1 according to preferred embodiment 1, $C1/r1 > C2/r2$ and $r1 < r2$ are satisfied, where C1 is the capacitance of the IDT electrode included in the segmented resonator 11A, C2 is the capacitance of the IDT electrode included in the segmented resonator 11B, r1 is the withdrawal ratio of the IDT electrode of the segmented resonator 11A (first withdrawal ratio), and r2 is the withdrawal ratio of the IDT electrode of the segmented resonator 11B (second withdrawal ratio).

That is to say, $C1/r1$ is the capacitance of the segmented resonator 11A in which no withdrawal electrode is provided, and $C2/r2$ is the capacitance of the segmented resonator 11B in which no withdrawal electrode is provided.

Because of this, it becomes possible to improve the reflection characteristic outside the pass band and reduce the level of spurious emissions while ensuring low loss within the pass band and steepness from both end portions of the pass band to attenuation bands by varying (dispersing) generation frequencies of spurious emissions generated outside the pass band. Moreover, with two segmented resonators that are connected in series (cascading connection), it becomes possible to improve the electric power handling capability.

1.5 Advantageous Effects and the Like

As described above, the acoustic wave filter 1 according to the present preferred embodiment includes the input/output terminals 110 and 120, and at least one series arm resonator circuit provided in the path connecting the input/output terminal 110 and the input/output terminal 120 or at least one parallel arm resonator circuit each arranged between the node in the path and ground or both the at least one series arm resonator circuit and the at least one parallel arm resonator circuit, wherein each of the at least one series arm resonator circuit or each of the at least one parallel arm resonator circuit or each of both the at least one series arm resonator circuit and the at least one parallel arm resonator circuit includes an acoustic wave resonator including the IDT electrode provided on the substrate having piezoelectricity, the first series arm resonator circuit of the at least one series arm resonator circuit or the first parallel arm resonator circuit of the at least one parallel arm resonator circuit includes the segmented resonator group including the first acoustic wave resonator and the second acoustic wave resonator, the first acoustic wave resonator and the second acoustic wave resonator being connected in series to one another, the IDT electrode included in the first acoustic wave resonator includes the first withdrawal electrode, the IDT electrode included in the second acoustic wave resonator includes the second withdrawal electrode, and $C1/r1 > C2/r2$ and $r1 < r2$ are satisfied where C1 is the capacitance of the IDT electrode included in the first acoustic wave resonator, C2 is the capacitance of the IDT electrode included in the second acoustic wave resonator, r1 is the withdrawal ratio of the IDT electrode included in the first acoustic wave resonator, and r2 is the withdrawal ratio of the IDT electrode included in the second acoustic wave resonator.

According to this, the level of spurious emissions outside the pass band is reduced by varying (dispersing) the withdrawal ratio for each of two segmented resonators included in the segmented resonator group 11, which are the segmented resonators 11A and 11B. Further, to reduce the level of spurious emissions of the segmented resonator 11B whose withdrawal ratio is higher, the capacitance of the IDT electrode of the segmented resonator 11B is relatively reduced. Moreover, to obtain a required capacitance for a favorable bandpass characteristic within the pass band of the acoustic wave filter 1, the capacitance of the IDT electrode of the segmented resonator 11A whose withdrawal ratio is lower is relatively increased. Because of this, it becomes possible to improve the reflection characteristic outside the pass band and reduce the level of spurious emissions while ensuring low loss within the pass band and steepness from both end portions of the pass band to attenuation bands.

Further, the acoustic wave filter 1 according to the present preferred embodiment includes the input/output terminals 110 and 120 and at least one series arm resonator circuit arranged in the path connecting the input/output terminal 110 and the input/output terminal 120 or at least one parallel arm resonator circuit each arranged between the node in the path and ground or both the at least one series arm resonator circuit and the at least one parallel arm resonator circuit, wherein each of the at least one series arm resonator circuit or each of the at least one parallel arm resonator circuit or each of both the at least one series arm resonator circuit and the at least one parallel arm resonator circuit includes an acoustic wave resonator including the IDT electrode provided on the substrate having piezoelectricity, the first series arm resonator circuit of the at least one series arm resonator circuit or the first parallel arm resonator circuit of the at least one parallel arm resonator circuit includes the segmented resonator group including the first acoustic wave resonator and the second acoustic wave resonator, the first acoustic wave resonator and the second acoustic wave resonator being connected in series to one another, and the product of the number of electrode fingers, the intersecting width, the electrode duty, and the electrode film thickness of the IDT electrode included in the first acoustic wave resonator is larger than the product of the number of electrode fingers, the intersecting width, the electrode duty, and the electrode film thickness of the IDT electrode included in the second acoustic wave resonator, and the withdrawal ratio of the IDT electrode included in the first acoustic wave resonator is smaller than the withdrawal ratio of the IDT electrode included in the second acoustic wave resonator.

According to this, the level of spurious emissions outside the pass band is reduced by varying (dispersing) the withdrawal ratio for each of two segmented resonators included in the segmented resonator group 11, which are the segmented resonators 11A and 11B. Further, to reduce the level of spurious emissions of the segmented resonator 11B whose withdrawal ratio is higher, the capacitance of the IDT electrode of the segmented resonator 11B that does not include the second withdrawal electrode is relatively reduced. Moreover, to obtain a required capacitance for a favorable bandpass characteristic within the pass band of the acoustic wave filter 1, the capacitance of the IDT electrode of the segmented resonator 11A that does not include the first withdrawal electrode is relatively increased. Because of this, it becomes possible to improve the reflection characteristic outside the pass band and reduce the level of spurious emissions while ensuring low loss within the pass band and steepness from both end portions of the pass band to attenuation bands.

Further, for example, the acoustic wave filter 1 may include the at least one series arm resonator circuit and the at least one parallel arm resonator circuit.

This enables the acoustic wave filter 1 to have a ladder filter structure.

Further, for example, the acoustic wave filter 1 may include the at least one series arm resonator circuit and a longitudinally coupled resonator or the at least one parallel arm resonator circuit and the longitudinally coupled resonator or the at least one series arm resonator circuit, the at least one parallel arm resonator circuit, and the longitudinally coupled resonator.

This enables the acoustic wave filter 1 to have a longitudinally coupled filter structure.

Further, for example, in the acoustic wave filter 1, the IDT electrode may include a pair of comb-shaped electrodes, the comb-shaped electrode including a plurality of electrode fingers and a busbar electrode, the plurality of electrode fingers being arranged in parallel or substantially in parallel to one another so as to extend in a direction that crosses an acoustic wave propagation direction, the busbar electrode connecting one-end portions of the electrode fingers included in the plurality of electrode fingers, and in the case where, of the plurality of electrode fingers, an electrode finger not connected to either one of the busbar electrodes included in the pair of comb-shaped electrodes is defined as a floating withdrawal electrode, of the plurality of electrode fingers, an electrode finger connected to the busbar electrode that is a same busbar electrode to which electrode fingers on both sides thereof are connected is defined as a reversed polarity withdrawal electrode, and of the plurality of electrode fingers, an electrode finger having a maximum electrode finger width is defined as a filling withdrawal electrode, the electrode finger width of the filling withdrawal electrode being wider than or equal to about twice an average electrode finger width of the electrode fingers excluding the filling withdrawal electrode, each of the first withdrawal electrode and the second withdrawal electrode may be any one of the floating withdrawal electrode, the reversed polarity withdrawal electrode, and the filling withdrawal electrode.

According to this, it becomes possible to improve steepness from both end portions of the pass band to attenuation bands.

Preferred Embodiment 2

2.1 Circuit Configuration of Multiplexer 4

The acoustic wave filter 1 according to preferred embodiment 1 can be provided in a multiplexer. Thus, in preferred embodiment 2 of the present invention, a multiplexer including the acoustic wave filter 1 is described.

Figure 6:
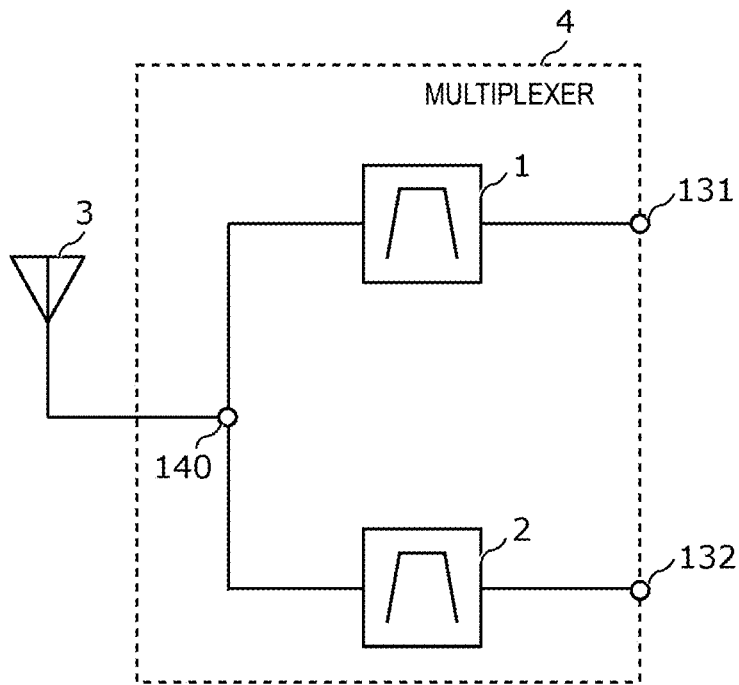
FIG. 6 is a circuit configuration diagram of a multiplexer according to a preferred embodiment 2 of the present invention.

FIG. 6 is a circuit configuration diagram of a multiplexer 4 according to preferred embodiment 2. As illustrated in FIG. 6, the multiplexer 4 includes a common terminal 140, an acoustic wave filter 1, a filter 2, and terminals 131 and 132.

The common terminal 140 is connected to an antenna 3 and the acoustic wave filter 1.

The acoustic wave filter 1 is the acoustic wave filter 1 according to preferred embodiment 1. For example, a pass band of the acoustic wave filter 1 is a downlink operation band (about 2620 MHz to about 2690 MHz) of Band 7 for LTE (Long Term Evolution).

Segmented resonators 11A and 11B of a segmented resonator group 11 included in the acoustic wave filter 1 each include one or more reversed polarity withdrawal electrodes. The structure of the withdrawal electrodes included in the segmented resonators 11A and 11B may be, for example, that of the floating withdrawal electrode or the filling withdrawal electrode or that of any other withdrawal electrode having an electrode structure different from those of the floating withdrawal electrode and the filling withdrawal electrode.

In the acoustic wave filter 1, the product of the number of pairs and the intersecting width of the IDT electrode included in the segmented resonator 11A is larger than the product of the number of pairs and the intersecting width of the IDT electrode included in the segmented resonator 11B, and the withdrawal ratio of the IDT electrode of the segmented resonator 11A (first withdrawal ratio) is smaller than the withdrawal ratio of the IDT electrode of the segmented resonator 11B (second withdrawal ratio).

In the acoustic wave filter 1, the capacitance of the IDT electrode included in the segmented resonator 11A may be larger than the capacitance of the IDT electrode included in the segmented resonator 11B, and the withdrawal ratio of the IDT electrode of the segmented resonator 11A (first withdrawal ratio) may be smaller than the withdrawal ratio of the IDT electrode of the segmented resonator 11B (second withdrawal ratio).

The filter 2 is one example of the first filter, includes a third input/output terminal (not illustrated) and a fourth input/output terminal (not illustrated), and has a pass band that is different from that of the acoustic wave filter 1. The third input/output terminal is connected to the common terminal 140. The fourth input/output terminal is connected to the terminal 132. For example, the pass band of the filter 2 is a downlink operation band (about 2110 MHz to about 2170 MHz) of Band 1 for LTE.

In the acoustic wave filter 1, frequencies of spurious emissions generated due to the withdrawal electrodes of the segmented resonator group 11 are included within the pass band of the filter 2.

Figure 7A:
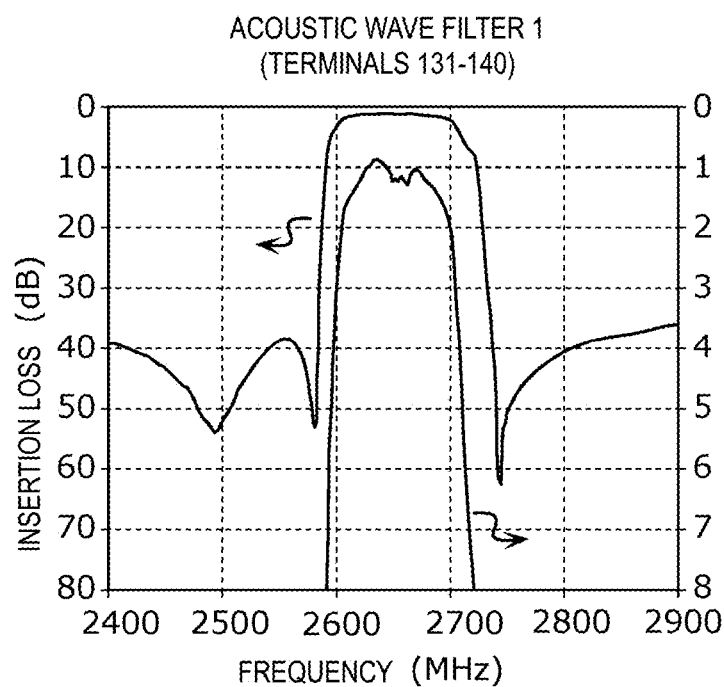
FIG. 7A is a graph illustrating a bandpass characteristic of an acoustic wave filter included in a multiplexer according to preferred embodiment 2 of the present invention.

FIG. 7A is a graph illustrating the bandpass characteristic of the acoustic wave filter included in the multiplexer according to preferred embodiment 2. FIG. 7A illustrates the bandpass characteristic between the terminal 131 and the common terminal 140 of the acoustic wave filter 1 included in the multiplexer 4. Even in the case where instead of the acoustic wave filter 1, the acoustic wave filter according to the comparative example is used in the multiplexer 4, a similar bandpass characteristic is obtained.

Figure 7B:
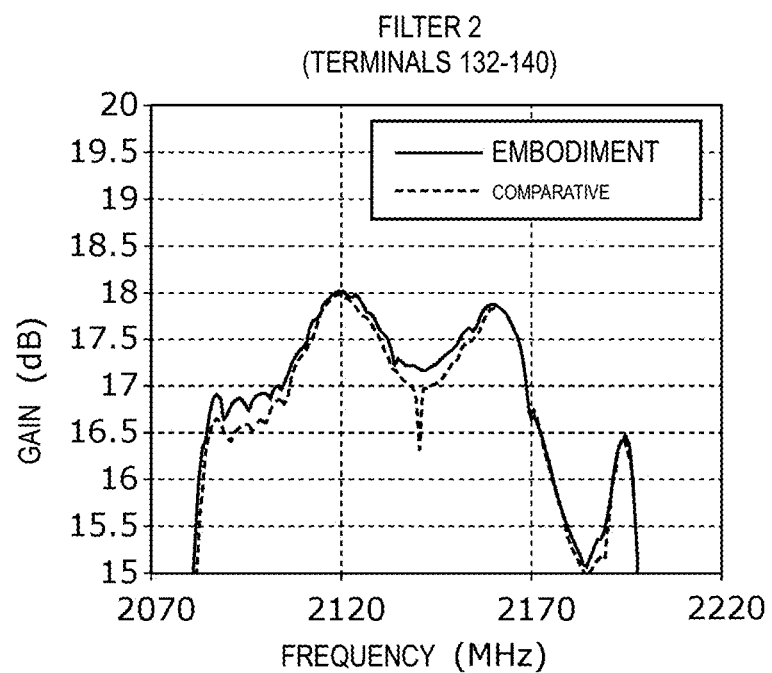
FIG. 7B is a graph illustrating bandpass characteristics of first filters included in multiplexers according to preferred embodiment 2 of the present invention and a comparative example.

FIG. 7B is a graph illustrating bandpass characteristics of the filters 2 included in multiplexers according to preferred embodiment 2 and the comparative example. In the multiplexer according to the comparative example, instead of the acoustic wave filter 1, the acoustic wave filter according to the comparative example is included. Further, FIG. 7B illustrates the bandpass characteristic (gain) that combines the filter 2 and a low-noise amplifier connected to the filter 2. As illustrated in FIG. 7B, in the multiplexer according to the comparative example, a drop (ripple) of the insertion loss (gain) that corresponds to spurious emissions caused by the acoustic wave filter according to the comparative example is provided within the pass band of the filter 2. In contrast, with the multiplexer 4 according to the present preferred embodiment, within the pass band of the filter 2, spurious emissions caused by the acoustic wave filter 1 are reduced, and thus, the drop (ripple) of the insertion loss (gain) corresponding to these spurious emissions is not provided within the pass band of the filter 2.

That is to say, in the multiplexer 4 according to preferred embodiment 2, the electrode parameters of the segmented resonators 11A and 11B included in the acoustic wave filter 1 are set as described above. Because of this, it becomes possible to reduce or prevent an increase in return loss in the pass band of the filter 2 when the acoustic wave filter 1 is seen from the common terminal 140. Accordingly, it becomes possible to provide the multiplexer 4 capable of reducing the level of spurious emissions outside the pass band while ensuring low loss within the pass band and steepness from both end portions of the pass band to attenuation bands in the acoustic wave filter 1 and further capable of suppressing degradation of the insertion loss within the pass band of the filter 2.

In the acoustic wave filter 1 included in the multiplexer 4 according to the present preferred embodiment, of the series arm resonator circuits and the parallel arm resonator circuits included in the acoustic wave filter 1, at least one of the first series arm resonator circuit and the first parallel arm resonator circuit, which includes the segmented resonator group 11, may be connected closest to the common terminal 140.

Of the acoustic wave resonators included in the acoustic wave filter 1, as the position of the acoustic wave resonator becomes closer to the common terminal 140, the bandpass characteristic of the filter 2 is more likely to be degraded by the spurious emissions generated in this acoustic wave resonator.

In the foregoing configuration, the segmented resonator group 11 that can reduce the generation of spurious emissions is arranged at the position closest to the common terminal 140, and thus, it becomes possible to effectively reduce or prevent the degradation of the bandpass characteristic of the filter 2 caused by the spurious emissions.

The multiplexer 4 has a configuration in which, for example, two filters (the acoustic wave filter 1 and the filter 2) are connected to the common terminal 140. However, the number of filters to be connected to the common terminal 140 is not limited to 2 and may alternatively be three or more.

Further, for example, a circuit element such as an inductor, a capacitor, a switch, a divider, a circulator, or the like, may be inserted between the common terminal 140 and the acoustic wave filter 1 and between the common terminal 140 and the filter 2.

2.2 Advantageous Effects and the Like

Further, the multiplexer 4 according to the present preferred embodiment includes the common terminal 140, the acoustic wave filter 1, and the filter 2 including a third input/output terminal and a fourth input/output terminal, a pass band of the filter 2 being different from that of the acoustic wave filter 1, wherein the common terminal 140 is connected to the input/output terminal 110 and the third input/output terminal.

According to this, it becomes possible to reduce or prevent an increase in return loss in the pass band of the filter 2 when the acoustic wave filter 1 is seen from the common terminal 140. Accordingly, it becomes possible to provide the multiplexer 4 capable of reducing the level of spurious emissions outside the pass band while ensuring low loss within the pass band and steepness from both end portions of the pass band to attenuation bands in the acoustic wave filter 1 and further capable of reducing or preventing degradation of the insertion loss within the pass band of the filter 2.

Further, for example, in the multiplexer 4, of the series arm resonator circuits and the parallel arm resonator circuits included in the acoustic wave filter 1, at least one of the first series arm resonator circuit and the first parallel arm resonator circuit, which includes the segmented resonator group 11, may be connected closest to the common terminal 140.

According to this, the segmented resonator group 11 that can reduce the generation of spurious emissions is arranged at the position closest to the common terminal 140, and thus, it becomes possible to effectively suppress the degradation of the bandpass characteristic of the filter 2 caused by the spurious emissions.

Another Preferred Embodiment and the Like

The acoustic wave filter and the multiplexer according to the preferred embodiments have been described above. However, the acoustic wave filter and the multiplexer according to the present invention are not limited to the foregoing preferred embodiments. Other preferred embodiments achieved by combining optional elements of the foregoing preferred embodiments, modified examples obtained by applying various modifications apparent to those skilled in the art to the foregoing preferred embodiments without departing the scope of the present invention, and various devices including the acoustic wave filters and the multiplexers according to the foregoing preferred embodiments may also be included in the present invention.

The acoustic wave resonator included in the acoustic wave filter 1 according to the foregoing preferred embodiments may be, for example, a SAW (Surface Acoustic Wave) resonator described above or a BAW (Bulk Acoustic Wave) resonator. SAW includes not only a surface wave but also a boundary wave.

Further, the filter 2 may be, for example, a SAW filter including a SAW resonator, a BAW filter including a BAW resonator, a LC filter, a dielectric filter, or the like, and may have an arbitrary filter structure.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter comprising:
    a first input/output terminal and a second input/output terminal; and
    at least one series arm resonator circuit in a path connecting the first input/output terminal and the second input/output terminal or at least one parallel arm resonator circuit each between a node in the path and ground or both of the at least one series arm resonator circuit and the at least one parallel arm resonator circuit; wherein
    each of the at least one series arm resonator circuit or each of the at least one parallel arm resonator circuit or each of both of the at least one series arm resonator circuit and the at least one parallel arm resonator circuit includes an acoustic wave resonator including an IDT (InterDigital Transducer) electrode on a substrate having piezoelectricity,
    at least one of a first series arm resonator circuit included in the at least one series arm resonator circuit and a first parallel arm resonator circuit included in the at least one parallel arm resonator circuit, includes a segmented resonator group including a first acoustic wave resonator and a second acoustic wave resonator, the first acoustic wave resonator and the second acoustic wave resonator being connected in series to one another;
    the IDT electrode included in the first acoustic wave resonator includes a first withdrawal electrode;
    the IDT electrode included in the second acoustic wave resonator includes a second withdrawal electrode; and
    $C1/r1 > C2/r2$ and $r1 < r2$ are satisfied where $C1$ is a capacitance of the IDT electrode included in the first acoustic wave resonator, $C2$ is a capacitance of the IDT electrode included in the second acoustic wave resonator, $r1$ is a withdrawal ratio of the IDT electrode included in the first acoustic wave resonator, and $r2$ is a withdrawal ratio of the IDT electrode included in the second acoustic wave resonator.

2. The acoustic wave filter according to claim 1, wherein the at least one series arm resonator circuit and the at least one parallel arm resonator circuit are included.

3. The acoustic wave filter according to claim 1, further comprising:
    a longitudinally coupled resonator.

4. The acoustic wave filter according to claim 1, wherein
    the IDT electrode includes a pair of comb-shaped electrodes each including a plurality of electrode fingers and a busbar electrode, the plurality of electrode fingers being in parallel or substantially in parallel to one another and extending in a direction that crosses an acoustic wave propagation direction, the busbar electrode connecting end portions of the electrode fingers included in the plurality of electrode fingers;
        of the plurality of electrode fingers, an electrode finger not connected to either one of the busbar electrodes included in the pair of comb-shaped electrodes is defined as a floating withdrawal electrode;
        of the plurality of electrode fingers, an electrode finger connected to the busbar electrode that is a same busbar electrode to which electrode fingers on both sides thereof are connected is defined as a reversed polarity withdrawal electrode; and
        of the plurality of electrode fingers, an electrode finger with a maximum electrode finger width is defined as a filling withdrawal electrode, the electrode finger width of the filling withdrawal electrode being wider than or equal to about twice an average electrode finger width of the electrode fingers excluding the filling withdrawal electrode;
    each of the first withdrawal electrode and the second withdrawal electrode is any one of the floating withdrawal electrode, the reversed polarity withdrawal electrode, and the filling withdrawal electrode.

5. A multiplexer comprising:
    a common terminal;
    the acoustic wave filter according to claim 1; and
    a first filter including a third input/output terminal and a fourth input/output terminal, a pass band of the first filter being different from a pass band of the acoustic wave filter; wherein
    the common terminal is connected to the first input/output terminal and the third input/output terminal.

6. The multiplexer according to claim 5, wherein of the at least one series arm resonator circuit and the at least one parallel arm resonator circuit included in the acoustic wave filter, at least one of the first series arm resonator circuit and the first parallel arm resonator circuit, which includes the segmented resonator group, is connected closest to the common terminal.

7. The multiplexer according to claim 5, wherein the at least one series arm resonator circuit and the at least one parallel arm resonator circuit are included.

8. The multiplexer according to claim 5, further comprising:
    a longitudinally coupled resonator.

9. The multiplexer according to claim 5, wherein
    the IDT electrode includes a pair of comb-shaped electrodes, the comb-shaped electrode including a plurality of electrode fingers and a busbar electrode, the plurality of electrode fingers being in parallel or substantially in parallel to one another and extending in a direction that crosses an acoustic wave propagation direction, the busbar electrode connecting one-end portions of the electrode fingers included in the plurality of electrode fingers;
    where:
        of the plurality of electrode fingers, an electrode finger not connected to either one of the busbar electrodes included in the pair of comb-shaped electrodes is defined as a floating withdrawal electrode;
        of the plurality of electrode fingers, an electrode finger connected to the busbar electrode that is a same busbar electrode to which electrode fingers on both sides thereof are connected is defined as a reversed polarity withdrawal electrode; and
        of the plurality of electrode fingers, an electrode finger with a maximum electrode finger width is defined as a filling withdrawal electrode, the electrode finger width of the filling withdrawal electrode being wider than or equal to about twice an average electrode finger width of the electrode fingers excluding the filling withdrawal electrode;
    each of the first withdrawal electrode and the second withdrawal electrode is any one of the floating withdrawal electrode, the reversed polarity withdrawal electrode, and the filling withdrawal electrode.

10. An acoustic wave filter comprising:
    a first input/output terminal and a second input/output terminal; and at least one series arm resonator circuit in a path connecting the first input/output terminal and the second input/output terminal or at least one parallel arm resonator circuit each between a node in the path and ground or both of the at least one series arm resonator circuit and the at least one parallel arm resonator circuit; wherein each of the at least one series arm resonator circuit or each of the at least one parallel arm resonator circuit or each of both of the at least one series arm resonator circuit and the at least one parallel arm resonator circuit includes an acoustic wave resonator including an IDT electrode on a substrate having piezoelectricity;

one of a first series arm resonator circuit included in the at least one series arm resonator circuit or a first parallel arm resonator circuit included in the at least one parallel arm resonator circuit or both of the first series arm resonator circuit and the first parallel arm resonator circuit, each include a segmented resonator group including a first acoustic wave resonator and a second acoustic wave resonator, the first acoustic wave resonator and the second acoustic wave resonator being connected in series to one another;

the IDT electrode included in the first acoustic wave resonator includes a first withdrawal electrode;

the IDT electrode included in the second acoustic wave resonator includes a second withdrawal electrode; and a product of a number of electrode fingers, an intersecting width, an electrode duty, and an electrode film thickness of the IDT electrode included in the first acoustic wave resonator is larger than a product of a number of electrode fingers, an intersecting width, an electrode duty, and an electrode film thickness of the IDT electrode included in the second acoustic wave resonator, and a withdrawal ratio of the IDT electrode included in the first acoustic wave resonator is smaller than a withdrawal ratio of the IDT electrode included in the second acoustic wave resonator.

11. The acoustic wave filter according to claim 10, wherein the at least one series arm resonator circuit and the at least one parallel arm resonator circuit are included.

12. The acoustic wave filter according to claim 10, further comprising:
a longitudinally coupled resonator.

13. The acoustic wave filter according to claim 10, wherein
the IDT electrode includes a pair of comb-shaped electrodes, the comb-shaped electrode including a plurality of electrode fingers and a busbar electrode, the plurality of electrode fingers being in parallel or substantially in parallel to one another and extending in a direction that crosses an acoustic wave propagation direction, the busbar electrode connecting one-end portions of the electrode fingers included in the plurality of electrode fingers;
where:
of the plurality of electrode fingers, an electrode finger not connected to either one of the busbar electrodes included in the pair of comb-shaped electrodes is defined as a floating withdrawal electrode;
of the plurality of electrode fingers, an electrode finger connected to the busbar electrode that is a same busbar electrode to which electrode fingers on both sides thereof are connected is defined as a reversed polarity withdrawal electrode; and
of the plurality of electrode fingers, an electrode finger with a maximum electrode finger width is defined as a filling withdrawal electrode, the electrode finger width of the filling withdrawal electrode being wider than or equal to about twice an average electrode finger width of the electrode fingers excluding the filling withdrawal electrode;
each of the first withdrawal electrode and the second withdrawal electrode is any one of the floating withdrawal electrode, the reversed polarity withdrawal electrode, and the filling withdrawal electrode.

14. A multiplexer comprising:
a common terminal;
the acoustic wave filter according to claim 10; and
a first filter including a third input/output terminal and a fourth input/output terminal, a pass band of the first filter being different from a pass band of the acoustic wave filter; wherein
the common terminal is connected to the first input/output terminal and the third input/output terminal.

15. The multiplexer according to claim 14, wherein of the at least one series arm resonator circuit and the at least one parallel arm resonator circuit included in the acoustic wave filter, at least one of the first series arm resonator circuit and the first parallel arm resonator circuit, which includes the segmented resonator group, is connected closest to the common terminal.

16. The multiplexer according to claim 14, wherein the at least one series arm resonator circuit and the at least one parallel arm resonator circuit are included.

17. The multiplexer according to claim 14, further comprising:
a longitudinally coupled resonator.

18. The multiplexer according to claim 14, wherein
the IDT electrode includes a pair of comb-shaped electrodes each including a plurality of electrode fingers and a busbar electrode, the plurality of electrode fingers being in parallel or substantially in parallel to one another and extending in a direction that crosses an acoustic wave propagation direction, the busbar electrode connecting one-end portions of the electrode fingers included in the plurality of electrode fingers;
of the plurality of electrode fingers, an electrode finger not connected to either one of the busbar electrodes included in the pair of comb-shaped electrodes is defined as a floating withdrawal electrode;
of the plurality of electrode fingers, an electrode finger connected to the busbar electrode that is a same busbar electrode to which electrode fingers on both sides thereof are connected is defined as a reversed polarity withdrawal electrode; and
of the plurality of electrode fingers, an electrode finger with a maximum electrode finger width is defined as a filling withdrawal electrode, the electrode finger width of the filling withdrawal electrode being wider than or equal to about twice an average electrode finger width of the electrode fingers excluding the filling withdrawal electrode;
each of the first withdrawal electrode and the second withdrawal electrode is any one of the floating withdrawal electrode, the reversed polarity withdrawal electrode, and the filling withdrawal electrode.

* * * * *